(12) United States Patent
Salcedo et al.

(10) Patent No.: US 7,479,414 B2
(45) Date of Patent: Jan. 20, 2009

(54) ELECTROSTATIC DISCHARGE PROTECTION DEVICE FOR DIGITAL CIRCUITS AND FOR APPLICATIONS WITH INPUT/OUTPUT BIPOLAR VOLTAGE MUCH HIGHER THAN THE CORE CIRCUIT POWER SUPPLY

(75) Inventors: Javier A. Salcedo, Orlando, FL (US); Juin J. Liou, Oviedo, FL (US); Joseph C. Bernier, Palm Bay, FL (US); Donald K. Whitney, West Melbourne, FL (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 11/871,269

(22) Filed: Oct. 12, 2007

(65) Prior Publication Data
US 2008/0044955 A1 Feb. 21, 2008

Related U.S. Application Data

(62) Division of application No. 11/330,139, filed on Jan. 12, 2006, now Pat. No. 7,285,828.

(60) Provisional application No. 60/643,692, filed on Jan. 12, 2005.

(51) Int. Cl.
*H01L 21/332* (2006.01)
(52) U.S. Cl. .................. 438/133; 438/135; 438/140
(58) Field of Classification Search .............. 438/133, 438/135, 140
See application file for complete search history.

(56) References Cited

U.S. PATENT DOCUMENTS 4,896,243 A 1/1990 Chartterjee et al.
5,343,053 A 8/1994 Avery
5,369,041 A 11/1994 Duvvury
5,453,384 A 9/1995 Chatterjee (Continued)

OTHER PUBLICATIONS

Ker et al., "Substrate-Triggered SCR Device for On-Chip ESD Protection in Fully Silicided Sub-0.25- μm CMOS Process," *IEEE Transaction on Electron Devices*, vol. 50, No. 2, Feb. 2003.
Salcedo et al., "Novel and Robust Silicon Controlled Rectifier (SCR) Based Devices for On-Chip ESD Protection," *IEEE Electron Device Letters*, vol. 25, No. 9, Sep. 2004.

*Primary Examiner*—Douglas M Menz
(74) *Attorney, Agent, or Firm*—MH2 Technology Law Group LLP

(57) ABSTRACT

An electrostatic discharge (ESD) device and method is provided. The ESD device can comprise a substrate doped to a first conductivity type, an epitaxial region doped to the second conductivity type, and a first well doped to the first conductivity type disposed in the substrate. The first well can comprise a first region doped to the first conductivity type, a second region doped to a second conductivity type, and a first isolation region disposed between the first region and the second region. The ESD device can also comprise a second well doped to a second conductivity type disposed in the substrate adjacent to the first well, where the second well can comprise a third region doped to the first conductivity type, a fourth region doped to the second conductivity type, and a second isolation region disposed between the third region and the fourth region. Still further, the ESD device can include a first trigger contact and second trigger contact comprising highly doped regions of either conductivity type, the first trigger contact disposed at a junction between the first well and the second well, and the second trigger contact disposed at either well.

25 Claims, 12 Drawing Sheets

U.S. PATENT DOCUMENTS

| | | |
|---|---|---|
| 5,455,436 A | 10/1995 | Cheng |
| 5,670,799 A | 9/1997 | Croft |
| 5,856,214 A | 1/1999 | Yu |
| 5,872,379 A | 2/1999 | Lee |
| 6,081,002 A | 6/2000 | Amerasekera et al. |
| 6,433,979 B1 | 8/2002 | Yu |
| 6,465,848 B2 | 10/2002 | Ker et al. |
| 6,566,715 B1 | 5/2003 | Ker et al. |

10. Tables

TABLE 1A

| Dev. Name | Dimensions (μm) | | | | | | | | | | | Connections | | | | | |
|---|---|---|---|---|---|---|---|---|---|---|---|---|---|---|---|---|---|
| | Lx | D1 | D2 | D3 | D4 | D5 | D6 | D7 | D8 | D9 | t | N-Tub | Anode | T1 | T2 | Cathode | Sub |
| N-DSTT 1 | 1.6 | 6.4 | 0.6 | 1.6 | 3.2 | 1.6 | 1.6 | 0.6 | 0.6 | 1.6 | 0 | O | Z | O | O | G | G |
| N-DSTT 1A | 1.6 | 6.4 | 0.6 | 1.6 | 3.2 | 1.6 | 1.6 | 0.6 | 0.6 | 1.6 | 0 | Z | Z | O | O | G | G |
| N-DSTT 2 | 3.2 | 3.2 | 0.6 | 1.6 | 1.6 | 1.6 | 1.6 | 0.6 | 0.6 | 1.6 | 0 | O | Z | O | O | G | G |
| N-DSTT 3 | 4.8 | 3.2 | 0.6 | 1.6 | 1.6 | 1.6 | 1.6 | 0.6 | 0.6 | 1.6 | 0 | O | Z | O | O | G | G |
| N-DSTT 3B | 4.8 | 3.2 | 0.6 | 1.6 | 1.6 | 1.6 | 1.6 | 0.6 | 0.6 | 1.6 | 0 | O | Z | O | T2 | G | G |
| N-DSTT 4 | 3.2 | 6.4 | 0.6 | 1.6 | 3.2 | 1.6 | 1.6 | 0.6 | 0.6 | 1.6 | 0 | O | Z | O | O | G | G |
| N-DSTT 5 | 4.8 | 4.8 | 0.6 | 1.6 | 3.2 | 1.6 | 1.6 | 0.6 | 0.6 | 1.6 | 0.6 | O | Z | O | O | G | G |

TABLE 1B

| Dev. Name | Dimensions (μm) | | | | | | | | | | | Connections | | | | | |
|---|---|---|---|---|---|---|---|---|---|---|---|---|---|---|---|---|---|
| | Lx | D1 | D2 | D3 | D4 | D5 | D6 | D7 | D8 | D9 | t | N-Tub | Anode | T1 | T2 | Cathode | Sub |
| P-DSTT 1 | 1.6 | 3.2 | 0.6 | 1.6 | 1.6 | 1.6 | 1.6 | 0.6 | 0.6 | 1.6 | 0 | O | Z | O | O | G | G |
| P-DSTT 1A | 1.6 | 3.2 | 0.6 | 1.6 | 1.6 | 1.6 | 1.6 | 0.6 | 0.6 | 1.6 | 0 | Z | Z | O | O | G | G |
| P-DSTT 2 | 3.2 | 3.2 | 0.6 | 1.6 | 1.6 | 1.6 | 1.6 | 0.6 | 0.6 | 1.6 | 0 | O | Z | O | O | G | G |
| P-DSTT 3B | 3.2 | 3.2 | 0.6 | 1.6 | 1.6 | 1.6 | 1.6 | 0.6 | 0.6 | 1.6 | 0 | O | Z | T2 | O | G | G |
| P-DSTT 4 | 1.6 | 6.4 | 0.6 | 1.6 | 3.2 | 1.6 | 1.6 | 0.6 | 0.6 | 1.6 | 0 | O | Z | O | O | G | G |
| P-DSTT 5 | 4.8 | 3.2 | 0.6 | 1.6 | 1.6 | 1.6 | 3.2 | 0.6 | 0.6 | 1.6 | 0 | O | Z | O | O | G | G |
| P-DSTT 6B | 4.8 | 6.4 | 0.6 | 1.6 | 3.2 | 1.6 | 1.6 | 0.6 | 0.6 | 1.6 | 0 | O | Z | T2 | O | G | G |

TABLE 2A

| Dev. Name | Dimensions (μm) | | | | | | | | | | | Connections | | | | |
|---|---|---|---|---|---|---|---|---|---|---|---|---|---|---|---|---|
| | L | D1 | D2 | D3 | D4 | D5 | D6 | D7 | D8 | D9 | t | N-Tub | Anode | T1 | Cathode | Sub |
| N-SSTT 1B | 6 | 3.2 | 0.6 | 1.6 | 1.6 | 1.6 | 1.6 | 0.6 | 0.6 | 1.6 | 0 | O | Z | T1 | G | G |
| N-SSTT 1 | 6 | 3.2 | 0.6 | 1.6 | 1.6 | 1.6 | 1.6 | 0.6 | 0.6 | 1.6 | 0 | O | Z | O | G | G |
| N-SSTT 1A | 6 | 3.2 | 0.6 | 1.6 | 1.6 | 1.6 | 1.6 | 0.6 | 0.6 | 1.6 | 0 | Z | Z | O | G | G |
| N-SSTT 2 | 6 | 6.4 | 0.6 | 1.6 | 3.2 | 1.6 | 1.6 | 0.6 | 0.6 | 1.6 | 0 | O | Z | O | G | G |

TABLE 2B

| Dev. Name | Dimensions (μm) | | | | | | | | | | | Connections | | | | |
|---|---|---|---|---|---|---|---|---|---|---|---|---|---|---|---|---|
| | L | D1 | D2 | D3 | D4 | D5 | D6 | D7 | D8 | D9 | t | N-Tub | Anode | T1 | Cathode | Sub |
| P-SSTT 1 | 0.6 | 3.2 | 0.6 | 1.6 | 1.6 | 1.6 | 1.6 | 0.6 | 0.6 | 1.6 | 0 | O | Z | O | G | G |
| P-SSTT 2 | 0.6 | 4.8 | 0.6 | 1.6 | 3.2 | 1.6 | 1.6 | 0.6 | 0.6 | 1.6 | 0 | O | Z | O | G | G |
| P-SSTT 3 | 3.6 | 3.2 | 0.6 | 1.6 | 1.6 | 1.6 | 1.6 | 0.6 | 0.6 | 1.6 | 0 | O | Z | O | G | G |
| P-SSTT 4B | 4.8 | 6.4 | 0.6 | 1.6 | 3.2 | 1.6 | 1.6 | 0.6 | 0.6 | 1.6 | 0 | O | Z | T2 | G | G |

TABLE 3

| Dimensions | General Action | | Direct Effects over I-V Characteristics of the Device | | | | | |
|---|---|---|---|---|---|---|---|---|
| | Increase | Decrease | $V_H$ | $V_T$ | Leakage | $R_{on}$ | $I_{max}$ | $I_T$ |
| L, Lx | x | | ↑ | ≅ | ≅ | ≅ | ↓ | ≅ |
| | | x | ↓ | ≅ | ≅ | ≅ | ↑ | ≅ |
| t | Reduce below 2λ | | Abrupt increment of electric field causing damages at snapbacks | | | | | |
| | x | | ↑ | ↑ | ↑ | ↑ | ↓ | ↑ |
| D1 | x | | ↑ | ≅ | ≅ | ↑ Slightly | ↓ | ↑ |
| D2 | x | | ≅ | ≅ | ≅ | ↑ | ↓ | ↑ |
| D3 | | x | ↑ | ≅ | ≅ | ↑ Slightly | ↓ | ≅ |
| D4 | x | | ↑ | ↑ | ≅ | ≅ | ↑ | ↑ |
| D5 | | x | ↑ | ≅ | ≅ | ↑ Slightly | ↓ | ≅ |
| D6 | x | | ↓ | ↓ | ≅ | ↓ Slightly | ↓ | ↓ |
| D7 | x | | ↑ | ↑ | ≅ | ↑ | ↓ | ≅ |
| D8 | x | | ≅ | ≅ | ≅ | ↑ | ↓ | ≅ |
| D9 | x | | ↓ | ↓ | ≅ | ≅ | ↑ | ↓ |

≅ : Low dependency, ↑ increase this parameter, ↓ decrease this parameter

ELECTROSTATIC DISCHARGE PROTECTION DEVICE FOR DIGITAL CIRCUITS AND FOR APPLICATIONS WITH INPUT/OUTPUT BIPOLAR VOLTAGE MUCH HIGHER THAN THE CORE CIRCUIT POWER SUPPLY

CROSS-REFERENCE TO RELATED APPLICATIONS

This application is a division of U.S. patent application Ser. No. 11/330,139 file Jan. 12, 2006, now U.S. Pat. No. 7,285, 828 which claims priority to U.S. Provisional Patent Application Ser. No. 60/643,692 filed on Jan. 12, 2005, the disclosures of which are incorporated by reference in their entirety.

FIELD OF THE INVENTION

The subject matter of this application relates to transistors. More particularly, the subject matter of this application relates to on-chip Electrostatic Discharge (ESD) Protection in Complementary Metal Oxide Semiconductor (CMOS) Integrated Circuits (ICs).

BACKGROUND OF THE INVENTION

Complementary Metal Oxide Semiconductor (CMOS) technology has for many years led the semiconductor industry in the fabrication of reliable and low-cost Integrated Circuits (ICs). The remarkable development of this technology is continuously evolving to fabricate smaller and faster devices for Very Large Scale Integration (VLSI) systems. The technology advance has in turn increased the CMOS devices' reliability problems, reducing the lifetime of the ICs and making them more sensitive to damage in the early steps of the production and assembly processes.

The IC's sensitivity to Electrostatic Discharge (ESD) is one of the most critical reliability problems in the semiconductor industry. ESD is an event that transfers a high amount of charge from one object (e.g., human body, transmission lines, or metallic pieces) to the other (e.g., microchip) in a relatively short period of time. The process results in an abrupt peak of current that can cause severe damage in the microchip.

ICs are required to pass testing to specific ESD standards. The standards define the typical waveform obtained during a particular type of ESD event. Each standard defines the characteristics of the rise time and decay time. In addition, the maximum peak of the ESD event can be defined to include the expected stress during the IC assembly, the type of application, and the final environment in which the IC is operating. The most widely use ESD standards are: 1) the human body model (HBM, charge transfers from human body to ground via the microchip); 2) the machine model (MM, charge transfers from a piece of equipment or metallic tool to ground via the microchip); 3) the charged device model (CDM, charge is built up on the microchip and transfers to ground); and 4) the system-level International Electrotechnical Commission standard for ESD immunity (e.g., IEC 1000-4-2, charge transfers from a charged capacitor through contact or air-gap discharge to ground via the microchip).

In the previous generations of micron- and sub-micron-level CMOS technologies, the IC ESD protection designs that comply with a required ESD standard have included schemes such as dual-diode I/O protection and a supply-clamp typically implemented with a Grounded-Gate Metal Oxide Semiconductor Field Effect Transistor (GGMOSFET). For some applications, both the I/O protection and the supply clamp are also implemented using different combinations of traditional devices, for instance a stack of zener diodes, medium voltage MOSFETs, Bipolar Junction Transistors (BJTs), and occasionally Silicon Controlled Rectifier (SCR)-type devices.

Some of the traditional ESD protection schemes can be migrated to a new generation of CMOS technology and still be effective in protecting particular applications. There are important complications though. The former ESD solutions typically cannot be readily scaled-down like the other components of an IC core circuit or migrated with the same sizes without paying an ESD performance penalty. For the newest CMOS technologies, the layout rules are stricter and the process characteristics are modified, such that the undesirable effects of the minimum feature size down-scaling are diminished. Nevertheless, these process improvements usually make the core circuit even more sensitive, and devices previously used for ESD protection may no longer be self-protected. Furthermore, the ICs are normally subjected by the customers to similar conditions and are required to comply with the same ESD standards as circuits in the former CMOS technologies.

Due to the ESD sensitivity of ICs in sub-micron CMOS technologies, devices for on-chip ESD protection can occupy a considerable area of the IC. Moreover, even increasing the size of the traditional protection structures to levels comparable with the core circuit dimensions does not guarantee that the ESD requirements are met. This condition creates a bottleneck for sub-micron IC development and diminishes the potential advantages of the CMOS scaling.

Limitations of typical ESD protection structures can be overcome by designing devices in which the current-voltage (I-V) characteristics show voltage snapback during an ESD event. These devices present a way to build smaller area I/O protection and supply clamps with very low leakage current during the normal operation of the circuit. The SCRs meet this characteristic, but the trigger voltage is very high and severe damage may occur in a sub-micron core circuit before the protection device triggers. The Low Voltage Trigger Silicon Controlled Rectifier (LVTSCR) triggers at relatively low voltages and it also shows snapback during the on-state. The LVTSCR has been used in the previous art for CMOS IC ESD protection, but it has the disadvantage that the holding voltage is very low and causes latchup problems in circuits where the I/O pad operation voltage is higher than about 1.2V. The High Holding Low Trigger Voltage Silicon Controlled Rectifier (HH-LVTSCR) allows tuning of the holding voltage in a wide range and at the same time keeps a relatively low trigger voltage.

The LVTSCRs and HH-LVTSCRs include a MOS (metal-oxide-semiconductor) structure that can modify the device's response during an ESD event and allows earlier triggering. Such devices in the previous art are safely used in CMOS technologies where they are self-protected and the gate of the devices can sustain the long-term voltage stress at the normal operating voltage, without reliability problems or degradation of the device characteristics. This assumption must be dismissed, however, for sub-micron CMOS applications which are required to pass a very high ESD voltage level, while operating to relatively high I/O voltages, close to- or exceeding- the level where the lifetime of the device is reduced by the effects of hot-carrier induced gate degradation.

Some alternatives have been previously discussed in the literature in order to overcome the gate reliability problem in the protection devices without degradation of the device's ESD performance. Solutions in prior art consider devices with a floating gate, sometimes referred to as devices with a dummy gate. However, these devices are highly dependent on the rise time and decay time of the ESD event as well as on temperature fluctuations. Results show that different versions of devices with floating gates exhibit characteristics that may cause a misleading interpretation of the device performance.

In a floating gate device, the conduction characteristics are unpredictably modified by the gate conditions. For instance, during an ESD event the gate MOS capacitor can become charged as a result of the ESD event. Since the gate voltage is not controlled, the charges underneath the gate are not immediately depleted back to the initial conditions and consequently the protection device can stay in the on-state. The leakage current through the channel of the protection device increases abruptly, leading to a circuit latchup, failure of the ESD protection, and/or further damage of the protected IC.

Thus, there is a need to overcome these and other problems of the prior art to obtain a protection device without gate reliability problems. Moreover, there is a need for sub-micron CMOS technology to be able to pass a high level of ESD current without latchup or damage. Further, there is a need for a device that can operate and protect against ESD during extreme temperature conditions, variable pulse rise times and pulse widths, and that is reliable during very extreme operating conditions.

SUMMARY OF THE INVENTION

In accordance with the present teachings, there is a substrate triggered thyristor (STT) with tunable trigger and holding voltages fabricated in complementary n- and p-types using a sub-micron CMOS technology. The STT is utilized for designing input/output (I/O) pad ESD protection and ESD supply clamps that are immune to latchup. The trigger and holding voltages of this device can be adjustable to protect both CMOS standard digital circuits and ICs with bipolar I/O signals higher than and lower than the core circuit power supplies. The measured TLP (transmission line pulse) current-voltage (I-V) characteristics demonstrate trigger voltages tunable in the range of 10 V to 20 V, holding voltage tunable in the range of 1.9 V to 16V, adjustable holding current, and low on-state resistance.

In accordance with the present teachings, there is a tunable thyristor device without a gate for the design of ESD protection at I/O pads and as a supply clamp for CMOS circuits. The device is designed using two different structures and also has complementary versions, n- and p-type. The disclosed protection device will be referred to hereinafter as a substrate triggered thyristor (STT). This device can be classified in two types: 1) n- and p-type double-substrate-triggered thyristor (n- and p-type DSTT) and 2) n- and p-type single-substrate-triggered-thyristor (n- and p-type SSTT). The present teachings provide a versatile, space-efficient, and reliable ESD protection device for a more robust implementation of ESD protection systems in advanced sub-micron CMOS technologies.

The n- and p-type STT devices can be fabricated using a standard sub-micron CMOS process. The spacing and dimensions of the doped regions of n- and p-type STTs can be adjusted to obtain different current-voltage (I-V) characteristics. The disclosed STTs can protect a core circuit in a broad range of applications including: 1) ICs where the I/O signal swings within the range of the core circuit power supplies, for example, a standard digital microchip, and 2) ICs where the I/O signal is bipolar and below/above the range of the core circuit power supplies, for example, communication transceivers included in personal computers, industrial applications, and as standard equipment for local area networks (LANs) and closed circuit security systems.

According to various embodiments, an electrostatic discharge (ESD) device is provided. The ESD device can comprise a substrate doped to a first conductivity type and a first well doped to the first conductivity type disposed in the substrate. The first well can comprise a first region doped to the first conductivity type, a second region doped to a second conductivity type, and a first isolation region disposed between the first region and the second region. The ESD device can also comprise a second well doped to a second conductivity type disposed in the substrate adjacent to the first well, where the second well can comprise a third region doped to the first conductivity type, a fourth region doped to the second conductivity type, and a second isolation region disposed between the third region and the fourth region. Still further, the ESD device can include a first trigger contact comprising a highly doped region disposed at a junction between the first well and the second well.

According to various embodiments, another electrostatic discharge (ESD) device is provided. The ESD device can comprise a substrate doped to a first conductivity type and an epitaxial layer formed in the substrate and doped to a second conductivity type. A first well can be disposed in the substrate and doped to the first conductivity type, the first well comprising a cathode comprising a first region doped to the first conductivity type and a second region doped to the second conductivity type and separated from the first region by a first isolation region. A second well can be disposed adjacent to the first well and doped to the second conductivity type, the second well comprising an anode comprising a third region doped to the first conductivity type. The ESD device can further include a first trigger contact having a length D1 disposed at a junction between the first well and the second well and between a second isolation region and a third isolation region.

According to various embodiments, a method of making an electrostatic discharge (ESD) device is provided. The method can comprise providing a substrate doped to a first conductivity type and forming a first well doped to the first conductivity type in the substrate. The first well can comprise a first region doped to the first conductivity type a second region doped to a second conductivity type, and a first isolation region disposed between the first region and the second region. The method can further comprise forming a second well doped to a second conductivity type in the substrate adjacent to the first well, the second well comprising a third region doped to the first conductivity type, a fourth region doped to the second conductivity type, and a second isolation region disposed between the third region and the fourth region. The method can also include forming a first trigger contact comprising a highly doped region a junction between the first well and the second well.

According to various embodiments, another method of making an electrostatic discharge (ESD) device is provided. The method can comprise providing a substrate doped to a first conductivity type, wherein the substrate comprises an epitaxial layer doped to a second conductivity type and forming a first well doped to the first conductivity type in the substrate. The method can further comprise forming a cathode in the first well, the cathode comprising a first region doped to the first conductivity type, a second region doped to the second conductivity type, and a first isolation region disposed between the first region and the second region. The method can also comprise forming a second well doped to the second conductivity type in the substrate adjacent to the first well and forming an anode in the second well, the anode comprising, a third region doped to the first conductivity type, a fourth region doped to the second conductivity type, and a second isolation region disposed between the third region and the fourth region. Still further, the method can comprise forming a first trigger contact comprising a highly doped region disposed at a junction between the first well and the second well.

It can be understood that both the foregoing general description and the following detailed description are exemplary and explanatory only and are not restrictive of the invention, as claimed.

The accompanying drawings, which are incorporated in and constitute a part of this disclosure, illustrate several embodiments of the invention and together with the description, serve to explain the principles of the invention.

TABLES 1A and 1B list the internal lateral dimensions of different n- and p-type 250 μm-width DSTTs, respectively. The corresponding holding voltage ($V_H$), trigger voltage ($V_T$) and on-state resistance (Ron) can be obtained from the TLP characteristics in FIGS. 7A and 7B;

TABLES 2A and 2B list the internal lateral dimensions of different n- and p-type 250 μm-width SSTTs, respectively. The corresponding $V_H$, $V_T$ and Ron can be obtained from the TLP characteristics in FIGS. 8A and 8B; and TABLE 3 summarizes the effects of changes in the internal dimensions on the STTs' $V_H$, $V_T$, Ron, and maximum failure current.

DESCRIPTION OF THE EMBODIMENTS

In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, not to be taken in a limited sense.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

In accordance with the present teachings there is a Substrate Triggered Thyristor (STT) ESD protection device for submicron CMOS technology. The STTs can be fabricated in complementary n- and p-types. The n- and p-type STTs show a sub-nanoamp leakage current in the off-state and a tunable holding voltage from less than 2 V to over 16 V.

Figure 1:
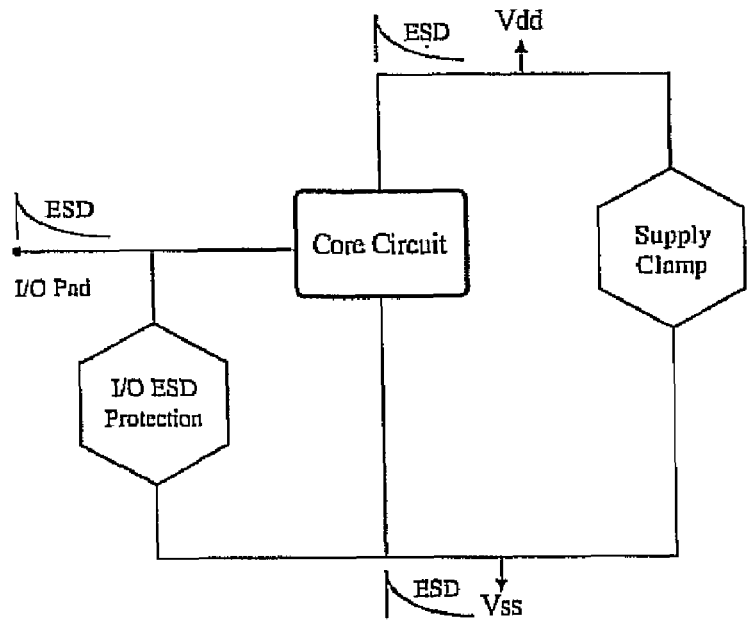
FIG. 1 is a schematic for I/O ground-referenced ESD protection and supply clamp.
Figure 2A:
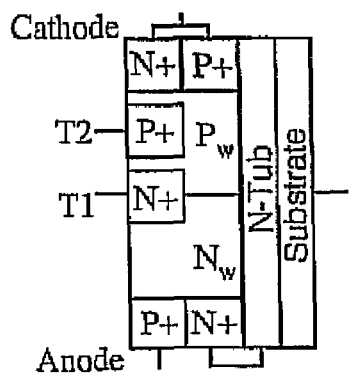
FIGS. 2A and 2B are circuit symbols for the n- and the p-type DSTT, respectively.
Figure 2B:
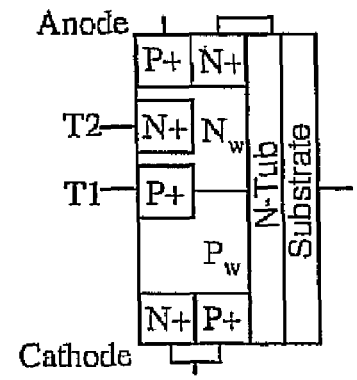
Figure 3A:
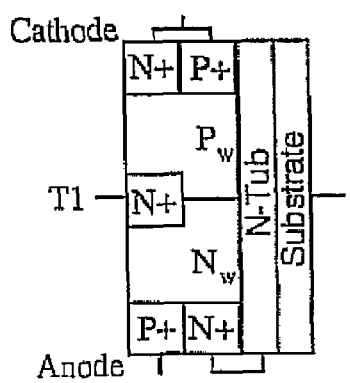
FIGS. 3A and 3B are circuit symbols for the n- and the p-type SSTT, respectively.
Figure 3B:
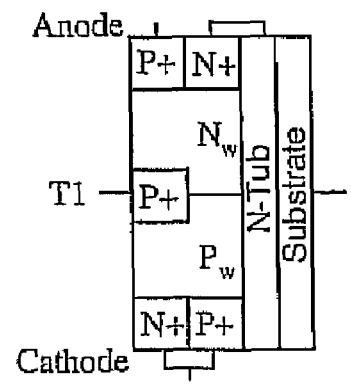

FIG. 1 shows a general schematic in which the STTs can be used for on-chip ESD protection. In this figure, ESD protection can be accomplished with a bidirectional I/O protection and bidirectional supply clamp, both of which are ground-referenced. Considering this ESD protection scheme, STT devices can be used for implementation of I/O protection and supply clamp, adjusted to a variety of ESD protection requirements in submicron CMOS ICs.

FIGS. 2A-2B and 3A-3B show the circuit symbols of the n- and p-type DSTTs and the SSTTs respectively. The STTs can be used for: 1) the design of ESD protection in standard digital circuits (see, for example, FIG. 4A) and 2) for the design of mixed-signal ESD protections, e.g., for data communication applications, which are required to operate at custom positive- and negative-I/O pad voltages, typically different than the core circuit power supplies (see, for example, FIGS. 4B and 4C).

Figure 4A:
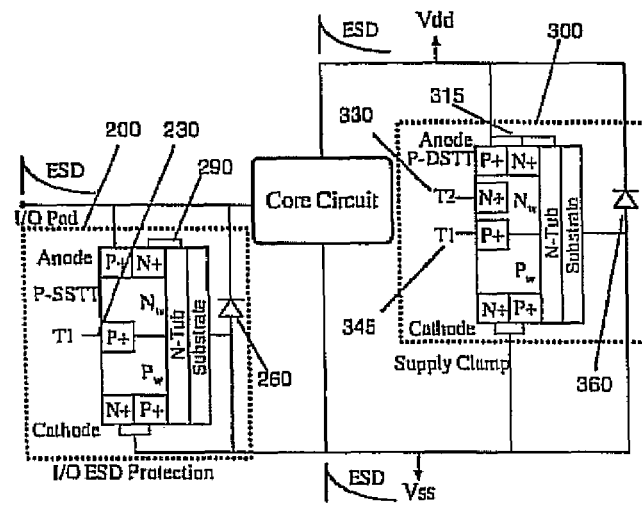
FIGS. 4A-4D are circuit diagrams for implementation of: 1) an ESD protection scheme with STTs for standard digital circuits (FIG. 4A); 2) an ESD protection scheme with STTs for circuits with bipolar I/O signals higher- and lower- than the core circuit power supply, (i.e. below Vss and above Vdd) (FIG. 4B); 3) an ESD protection scheme for ICs with bipolar I/O (similar to the condition in 2), which includes a protection with a zener diode and an STT at the I/O (FIG. 4C); and 4) two typical zener and resistor trigger circuit that define T1 and T2 in TABLES 1 and 2 (FIG. 4D).

FIG. 4A shows a detailed diagram of an ESD protection scheme using a P-DSTT for the supply clamp 300 and a P-SSTT for the I/O ESD protection cell 200. This particular scheme is applicable for the scenario where the normal operating voltage at the I/O pad is always higher than Vss. The I/O ESD protection can have a triggering electrode floating or interconnected to a logical circuit 230, a clamp diode 260, with the cathode connected to the I/O pad and anode to Vss, having the breakdown voltage of the diode higher than the triggering voltage of the P-SSTT, an external or internal interconnection 290 to short the graded doping concentration between the highly doped n-type region and the tub region of the same conductivity type. The supply clamp can have an interconnection 315 between the highly doped regions of different conductivity types and the n-tub, such that the embedded diode formed between the substrate and anode is parallel to the diode clamp 360 and shares Vss to Vdd conduction. The shunt diode 360 can have similar or higher breakdown voltage than the P-DSTT, and the dual triggering electrodes, 330 and 345, can alternatively be open or connected to a control logic circuit.

Figure 4B:
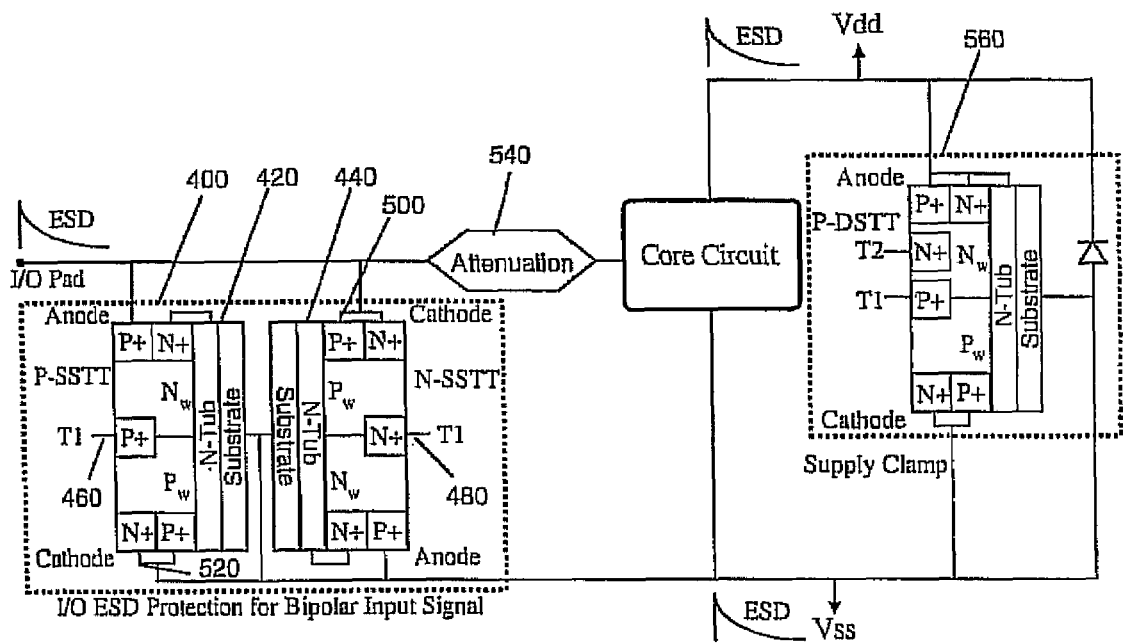
Figure 4C:
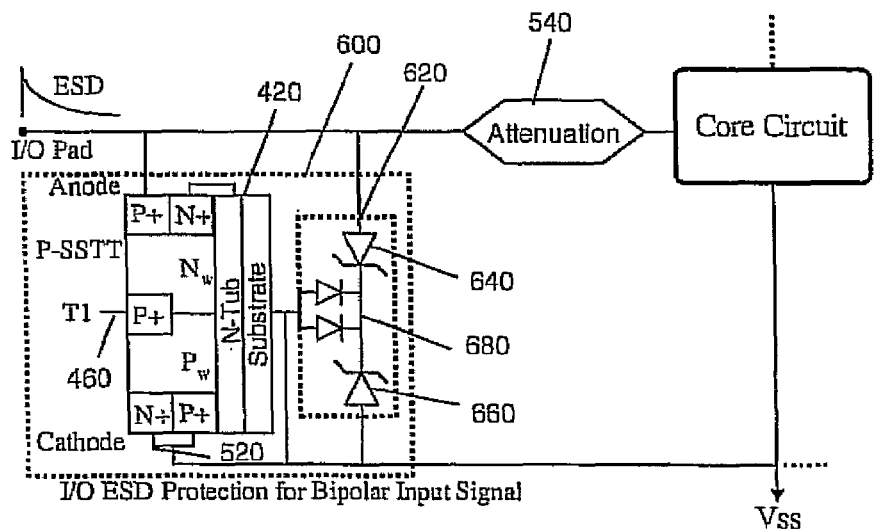

A different protection scheme is required if the normal I/O operating voltage is bipolar and outside the range of both of the power supplies, e.g. above Vdd and below Vss. For such a condition, FIGS. 4B and 4C show ESD protection schemes that include supply clamp 560, and either parallel ground-referenced n- and p-type SSTTs (440 and 420) comprising I/O ESD protection 400 as in FIG. 4B, or p-type SSTTs 420 and shunt diode 620 comprising I/O ESD protection 6001 as in FIG. 4C. The embodiment in FIG. 4B has first- and second-protection elements (420 and 440). A first electrode 520 of the first protection element is connected to the Vss power rail and to two highly doped regions of different conductivity type, the second electrode is connected to the pad, and a trigger electrode 460 is either connected to a logical triggering circuit or left floating. The first electrode of the second device 500 is connected to the pad and to two highly doped regions of different conductivity type, the second electrode is connected to the Vss power rail, and a second triggering electrode 480, is independently connected to a logical triggering circuit or left floating.

The embodiment in FIG. 4C, has a coupled STT-diode clamp scheme 600 for I/O ESD protection. The STT-diode clamp includes: a first electrode 520 of the first protection element connected to the Vss power rail and to two highly doped regions of different conductivity type, the second electrode connected to the pad, and a trigger electrode 460 connected to a logical triggering circuit or left floating. A diode clamp including a stack of devices (640 and 660) blocks conduction below Vss and above Vdd at the predetermine voltage. The diode stack also comprises substrate diodes, 680, wherein the substrate diodes need to be considered in the design to avoid conduction within the IC operating conditions.

Figure 4D:
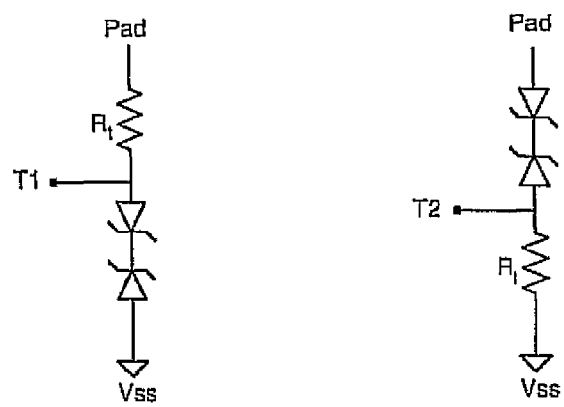

The schemes shown in FIGS. 4A, 4B, and 4C can be implemented using different combinations of the STT devices. Each STT depicts different I-V characteristics, and the choice depends on the specific requirements of ESD protection design. FIG. 4D shows two zener-resistor trigger circuits that can be alternatively used in conjunction with the STTs. Other more sophisticated trigger circuits can also be used together with the STT devices. Such trigger circuits can be customized using logic control, while other more general-use triggering circuits are found in the literature and summarized by Ker et al. in U.S. Pat. No. 6,566,715 B1, which is incorporated herein by reference in its entirety.

The ESD protection schemes depicted in FIGS. 4A, 4B, and 4C are further strengthened with other advantages over standard ESD protection schemes, such as: 1) reduction of the number of devices for the complete ESD protection and therefore less parasitic effects, because protection is provided with just ground-referenced protection devices, as opposed to multiple protection components connected from the I/O pad to both power rails. The reduction in parasitic effects follows from the reduction in the number of devices connected to the I/O pad; 2) less perturbations/noise pulled-up from the I/O pads to the power supply through an ESD protection device due to a) absence of an explicit ESD protection structure from the I/O pad to Vdd and b) smaller (and therefore less capacitance) structures from the I/O pads to Vss; and 3) a higher ratio of ESD protection level per unit area along with a reduction in the required size for the Vdd power rail protection due to the low holding voltage of the STTs. The low holding voltage implies lower power dissipation at the high currents in the ESD pulse. Lower power dissipation allows smaller total device size for the same allowed peak temperature (i.e. failure point). For these protection schemes, and for general purpose protection structures, the STT devices can meet different customized conduction characteristics, commonly required for the design of very large scale integration (VLSI) mixed-signal circuits.

Cross-sectional views of exemplary n- and p-type DSTT and SSTT are depicted in FIGS. 5A and 5B and 6A and 6B, respectively. These devices can be fabricated using a standard silicided triple-well sub-micron CMOS process. The tuning of the device I-V characteristics can be accomplished by adjusting the internal lateral dimensions indicated in FIGS. 5A and 5B and 6A and 6B.

Figure 5A:
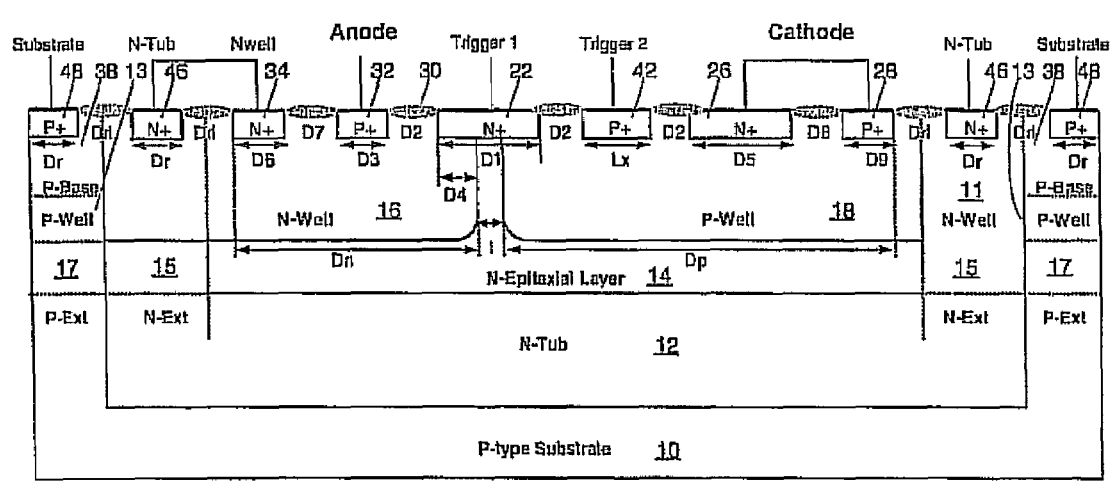
FIGS. 5A and 5B are cross-sectional views of the n- and p-type DSTTs, respectively.
Figure 6A:
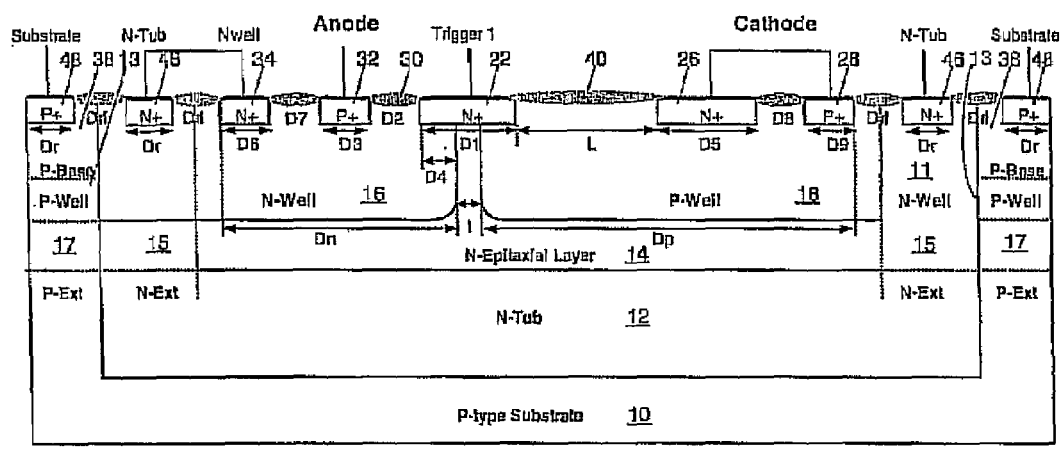
FIGS. 6A and 6B are cross-sectional views of the n- and p-type SSTTs, respectively.

FIGS. 5A and 6A show an N-Tub layer 12 formed on the surface of a p-type silicon wafer 10 with an n-type Epitaxial layer 14. N-Extensions 15, N-Well 11, and LDD N$^+$ 46 are implanted at both sides of the device, and this n-type region extends to the N-Tub 12. P-Extensions 17, P-Base 38, P-Well 13, and LDD P$^+$ 48 are implanted at both sides of the device and this p-type region extends to the p-type substrate 10. The n- and the p-type regions previously described form a so called guard-ring (also referred to herein as a guard-ring isolation) around the effective area of the STT device.

Figure 5B:
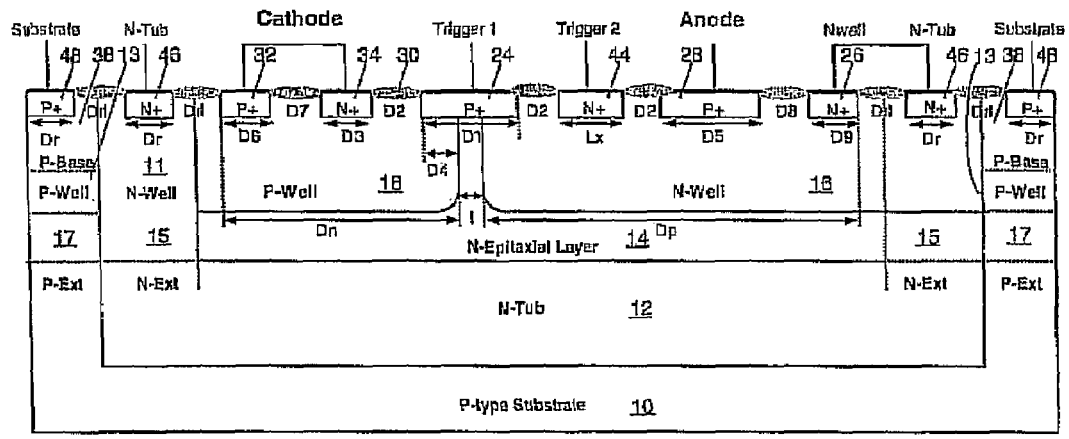
Figure 6B:
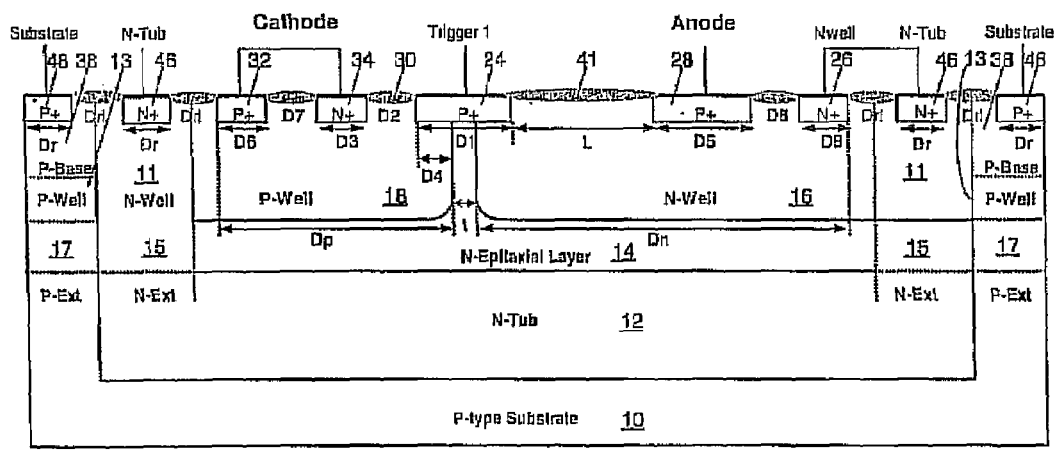

FIGS. 5B and 6B show an N-Tub layer 12 formed on the surface of a p-type silicon wafer 10 with an n-type Epitaxial layer 14. N-Extensions 15, N-Well 11, and LDD N$^+$ 46 are implanted at both sides of the device, and this n-type region extends to the N-Tub 12. P-Extensions 17, P-Base 38, P-Well 13, and LDD P$^+$ 48 are implanted at both sides of the device and this p-type region extends to the p-type substrate 10. The n- and the p-type regions previously described form a so called guard-ring around the effective area of the STT device. The guard ring can be customized to increase the anode/cathode-to-p-side of the guard ring breakdown.

An N-Well 16 is implanted to be used as an intermediate layer in the anode side of the n- and p-type STTs. A P-Well 18 is implanted into the N-Epitaxial-layer 14 parallel to the previous N-Well to be used as an intermediate layer in the cathode side of the n-type and p-type STTs. These wells extend in the vertical and the lateral directions. In the vertical direction, the wells extend into the N-Epitaxial layer 14 and in the lateral direction they create a junction, also called a blocking p-n junction in the center of the STT. According to various embodiments, the junction can be formed at the interface between the two wells. Alternatively, the junction can include a gap separating the two wells by a distance "t". The gap "t" between the N-Well 16 and the P-Well 18 can be designed to increase the magnitude of the trigger voltage and holding current. According to various embodiments, the distance "t" can be 800 nm or less. Still further, the gap can be lightly doped and in certain embodiments, the gap can have a graded doping profile, in the lateral direction and/or in the vertical direction.

The LDD N+ region 22 in FIGS. 5A and 6A and the P+ region 24 in FIGS. 5B and 6B, are implanted over the junction or gap between the N-Well 16 and P-Well 18 for the n- and p-type STTs, respectively. The LDD N+ region 22 and the P+ region 24 can be part of first trigger contacts formed in the n- and p-type devices, respectively. As shown in the Figures, the LDD N+ region 22 and the P+ region 24 can be defined by a distance D1. According to various embodiments, the distance D1 can be from about 500 nm to about 11.2 μm. Moreover, by varying the distance D1, various parameters of the device can be varied, such as, for example, the on-state holding voltage. According to various embodiments, LDD N+ region 22 and LDD P+ region 24 can be considered highly doped with respect to other regions in the device.

LDD N+ and LDD P+ regions 26, 28 are implanted in the P-Well 18 and the N-Well 16 for the n- and p-type STTs, respectively. Regions 26 and 28 are the cathode of the n-type STT and the anode of the p-type STT, respectively. The regions 26 and 28 can be interconnected in several configurations such as, for example those shown in FIGS. 4A, 4B, and 4C.

LDD P+ and N+ regions 32, 34 are implanted in the N-Well 16 and P-Well 18 for the n- and p-type STTs, respectively. Regions 32 and 34 are the anode of the n-type STT and the cathode of the p-type STT, respectively. The regions 32 and 34 can be interconnected in some configurations such as, for example those shown in FIGS. 4A and 4B.

Isolation regions are formed between various doped regions of the device. For example, in FIGS. 5A and 5B, an isolation region is formed between the regions 26 and 28, between regions 32 and 34, between regions 22 and 42, which is described below, and region 22, between region 22 and 32, and between region 26 and 42. These isolation regions are shown to have a length D2. For the n- and p-type SSTTs shown in FIGS. 6A and 6B, isolation regions 40 and 41 of length L are formed in the P-Well 18 for the n-type SSTT and in the N-Well 16 for the p-type SSTT. According to various embodiments, the lengths of the various isolation regions can be from about 500 nm to about 6.0 μm, in some embodiments, from about 500 nm to about 3.5 μm, in other embodiments, from about 500 nm to about 1.5 μm, and in still further embodiments, from about 500 nm to about 1.0 μm. Other exemplary lengths of the various isolation regions are shown in TABLES 1A-2B. According to various embodiments, the trigger and on-state holding voltages of the various devices can be adjusted by varying the lengths of the isolation regions. Further, the various isolation regions can each be the same length or they can be different lengths, according to the desired operating parameters.

According to various embodiments, the isolation regions can be formed using in insulator material or a silicide material. For example, the isolation regions can be formed by Local Oxidation of Silicon (LOCOS), implantation of oxygen or other material so as to form an insulating material, or by a silicide process.

A second trigger contact is formed by LDD P+ and LDD N+ regions 42 and 44 of dimension Lx implanted in the n- and p-type DSTT, respectively, as shown, for example in FIGS. 5A and 5B. This region provides ohmic contact in the P-Well and N-Well regions, respectively, for a more flexible design of alternative triggering of the STT by external injection of current. According to various embodiments, the dimension Lx can be from about 500 nm to about 6.5 μm. Other exemplary lengths of Lx are shown in TABLES 1A and 1B.

According to various embodiments, the trigger and on-state holding voltages of the various devices can be adjusted by varying the length of the second trigger contact. Moreover, varying the length of the second trigger contact can control the gain of anode embedded bipolar junction transistors during on-state regenerative feedback.

The LDD N+ regions 22, 26, 34, 44 and 46 are typically implanted in the same process step, but they may be formed in separate implantation steps. The same observation applies to all the LDD P+ regions 24, 28, 32, 48, and 42.

FIGS. 5A and 5B and FIGS. 6A and 6B also show the different lateral dimensions adjusted in the n- and p-type STTs. The I-V characteristics of these devices have been measured on-wafer using a Barth 4002 transmission line pulsed (TLP) instrument, which provides square pulses 100 ns wide with variable rise times of 200 ps, 2 ns, and 10 ns. FIGS. 7A and 7B and FIGS. 8A and 8B compare the measured TLP I-V characteristics using a 10 ns pulse rise time for the devices presented in TABLES 1 and 2. FIGS. 7A and 7B and FIGS. 8A and 8B show a sample of different I-V characteristics that can be obtained for various STT devices. The STTs exhibit a very low leakage current in the off-state (tens of picoamps at 5 Volts), for a 250 micron wide device), very high conducting current in the on-state (over 10 amps), and wide-range tunable trigger and holding voltages, all of which are of paramount importance for the design and development of effective and versatile on-chip ESD protection structures. The triggering point can be determined by the externally applied triggering control or by the predetermined breakdown voltage of the blocking junction in the anode to cathode current path, while the holding voltage can be tuned by adjusting the dimensions of the internal implantations, the net effect of which is the adjustment of the current gain and injection efficiency during the device's regenerative feedback on-state. This flexibility is not provided by the prior art nor by other standard devices built in sub-micron CMOS processes, and its lack has given rise to costly delays in the production and tape out of many IC products due to high ESD sensitivity in the prototype designs and failure of the traditional schemes of ESD protection.

The STT devices allow the design of tunable I-V characteristics and a high ratio of ESD performance per unit area. The interacting physical effects during the conduction conditions of the STT can be modified by varying the device's internal lateral dimensions. Changes in one dimension can improve some characteristics of the device but may degrade others. Equivalent circuits are presented for understanding of the device physics and for further use in the mathematical modeling of the device in standard CAD tools for circuit designers.

Figure 7A:
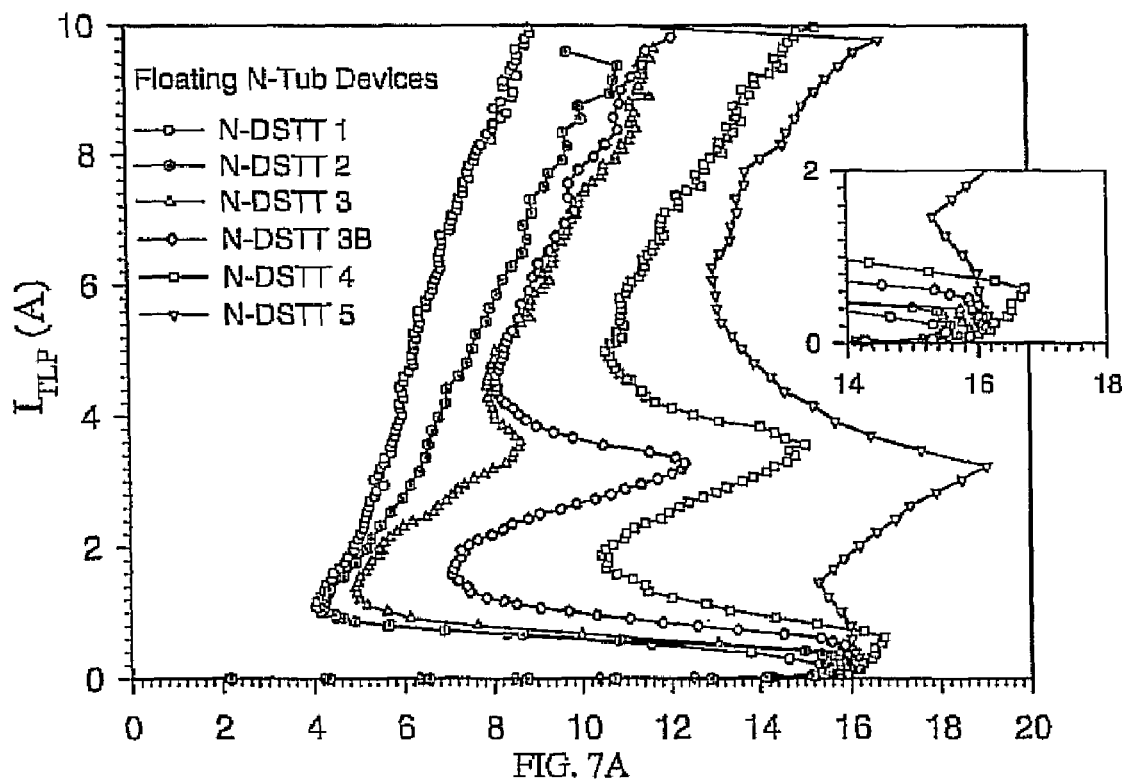
FIGS. 7A and 7B are measured TLP I-V characteristics for the n- and p-type DSTTs, respectively.

The STTs are designed in n- and p-type versions with optional single- and double-substrate triggers. FIGS. 7A and 7B and FIGS. 8A and 8B show the TLP I-V characteristics obtained for different types of STTs. FIG. 7A shows the measured TLP characteristics of different n-type DSTTs such as those described in TABLE 1A. For the DSTT in this example, the trigger voltage is shown in the range of 15-16 V, and the holding voltage is variable, in the range of about 2 to 14 V. The trigger voltage, however, can be changed using an alternative triggering circuit.

Figure 7B:
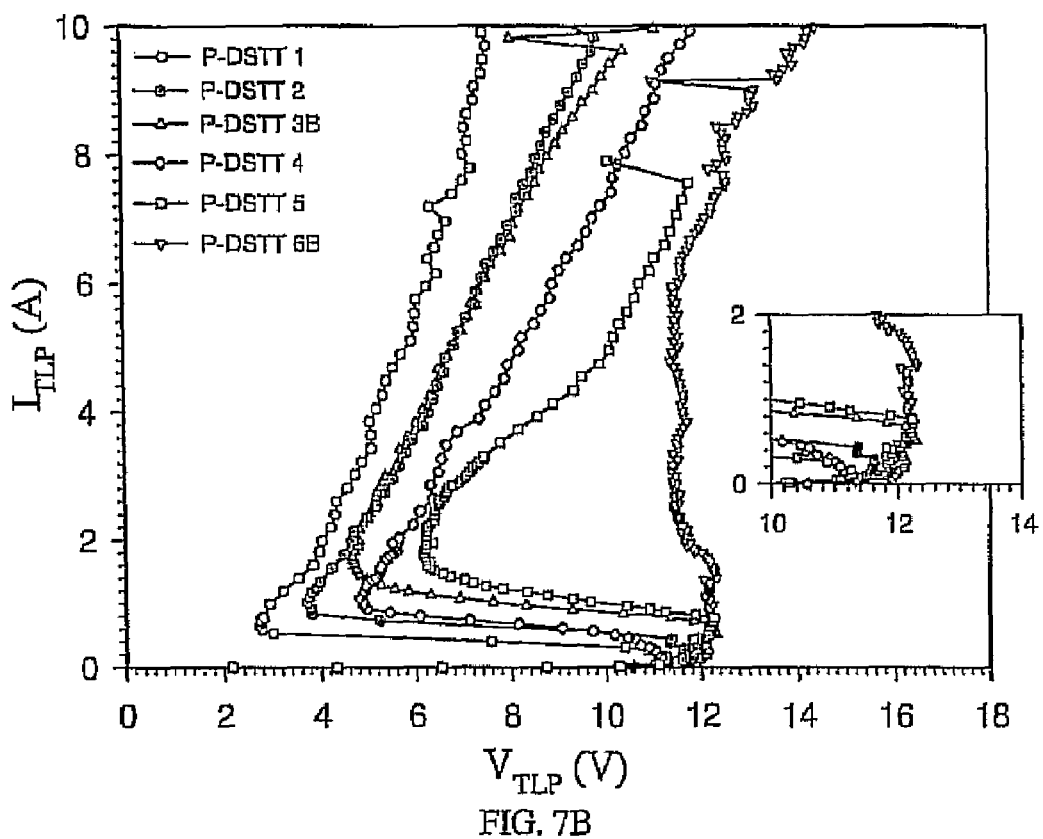

FIG. 7B depicts the measured TLP characteristics of p-type DSTTs such as those described in TABLE 1B. For this device the trigger voltage is in the range of about 11 to 12 V and the holding voltage is variable from about 1.5 to 12 V. For higher holding voltages the failure TLP current is lower but the effective power that the devices withstand is comparable for all the cases. The devices named with the letter 'B' at the end include a simplified trigger circuit such as a zener diode and resistance at 12 V (see FIG. 4D), which increases the holding current and triggers the device close to the conduction point of the zener diode.

Figure 8A:
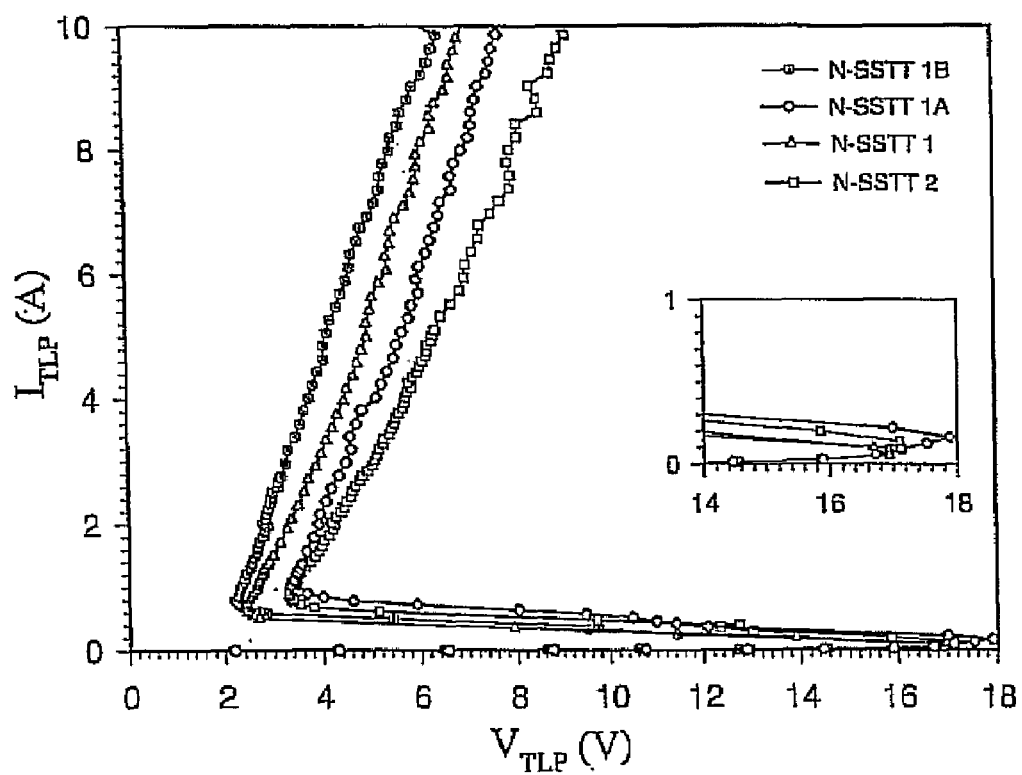
FIGS. 8A and 8B are measured TLP I-V characteristics for the n- and p-type SSTTs, respectively.

FIG. 8A depicts the measured TLP characteristics of the n-type SSTT such as that described in TABLE 2A. The n-type SSTT in this example allows a tuning of the holding voltage in the range of about 1.9 to about 5 V and triggering from levels about 16 V to voltages even higher than the 18 V scale depicted in FIG. 8A. This figure compares the effect of three different connections in a device with similar internal dimensions. The device N-SSTT 1 is the basic device, N-SSTT 1A is a similar device with an anode-N-Tub interconnection, and N-SSTT 1B is a similar device connected to a zener-resistance triggering circuit. The anode-N-Tub interconnection slightly increases the trigger voltage and also increases the holding current and holding voltage. For N-SSTT 1B the trigger voltage is not significantly changed with the current injection provided by the simplified triggering circuit, but the holding current is increased and the on-state resistance is slightly improved.

Figure 8B:
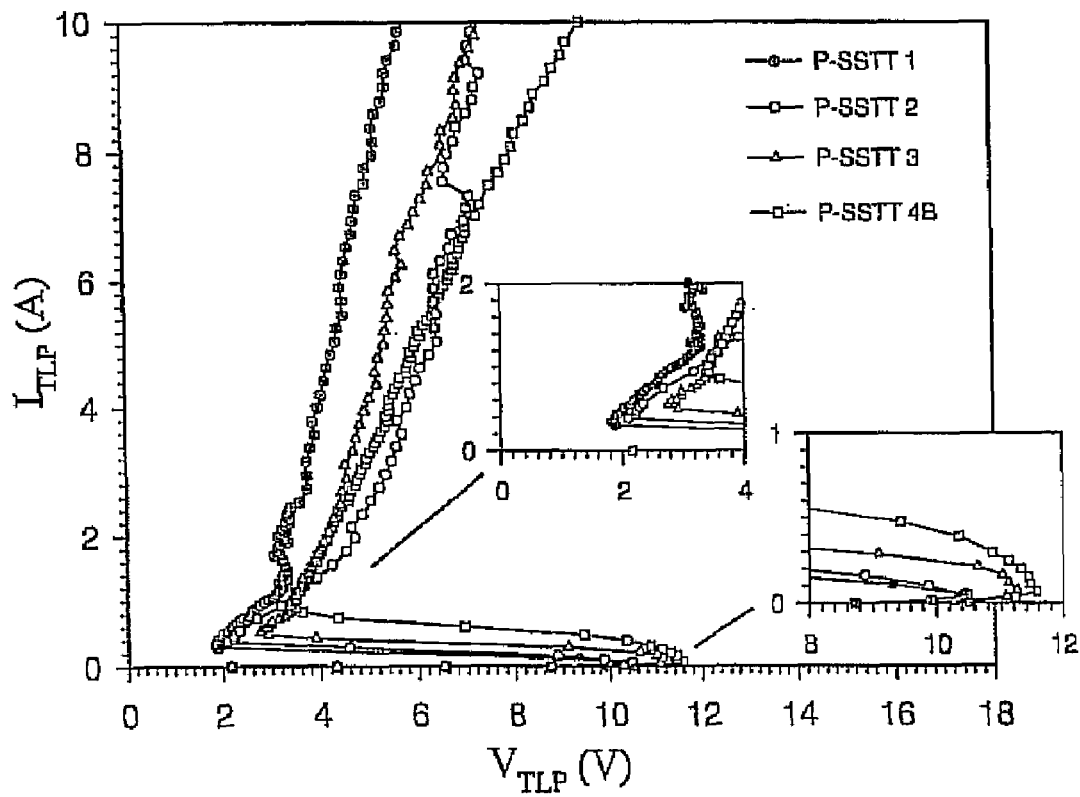

FIG. 8B depicts the measured TLP characteristics of the p-type SSTT such as that described in TABLE 28. The trigger voltage is variable in the range of about 10 to about 12 V and the holding voltage can be easily tuned in the range of about 2 to about 4 V. Holding voltages higher than about 0.5V are also designed in the p-type SSTT by introducing a lower doping concentration, e.g. a P-Base, in the region 24 of FIG. 6B. This change increases the trigger voltage to about 12.5 V.

Figure 9A:
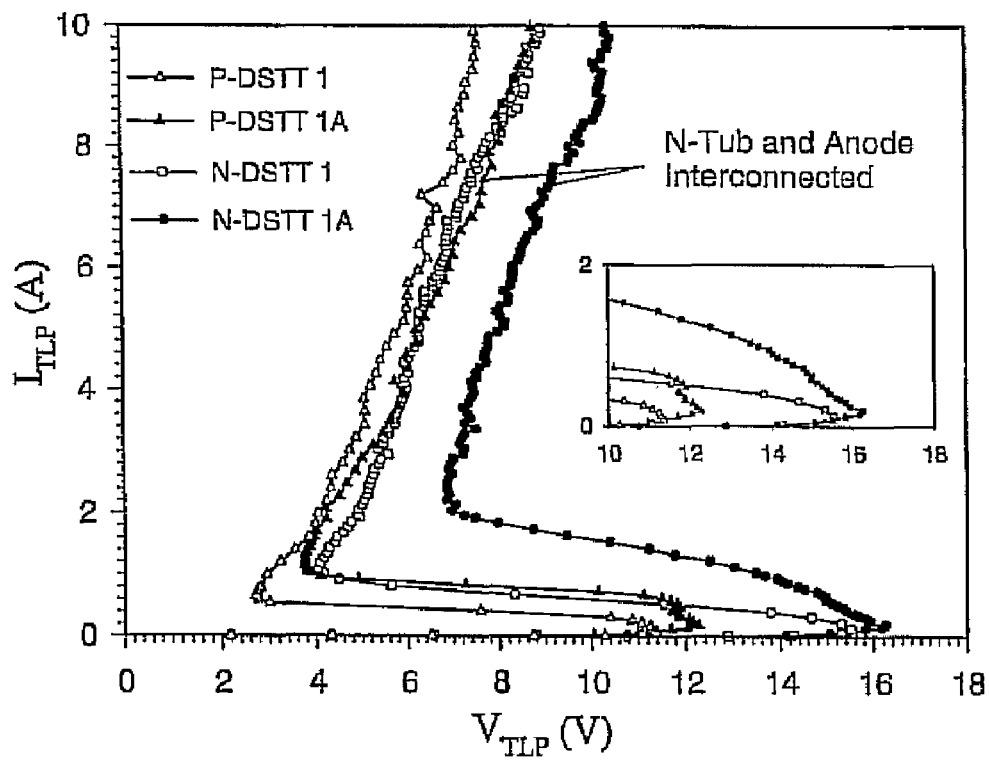
FIGS. 9A and 9B compare the measured TLP I-V characteristics for the forward- and reverse-conduction of STTs with floating N-Tub and N-Tub connected to the STTs anode. The effect of the different interconnections on the forward conduction is illustrated by presenting four TLP I-V characteristics in the same plot. Two of them correspond to an n-type DSTT and the other two correspond to a p-type DSTT.

FIG. 9A compares the measured TLP characteristics for n- and p-type DSSTs with similar lateral dimensions. For the devices with a floating N-Tub, the trigger and holding voltages are lower due to the effect of the open base in the parasitic PNP BJT in the anode side. In general, the trigger and holding voltages of the p-type devices are lower than the n-type devices. Each one of these characteristics though, is desirable for different ICs' operating conditions and can provided all the necessary information to the circuit designers in order to make the appropriate choice for each application.

Figure 9B:
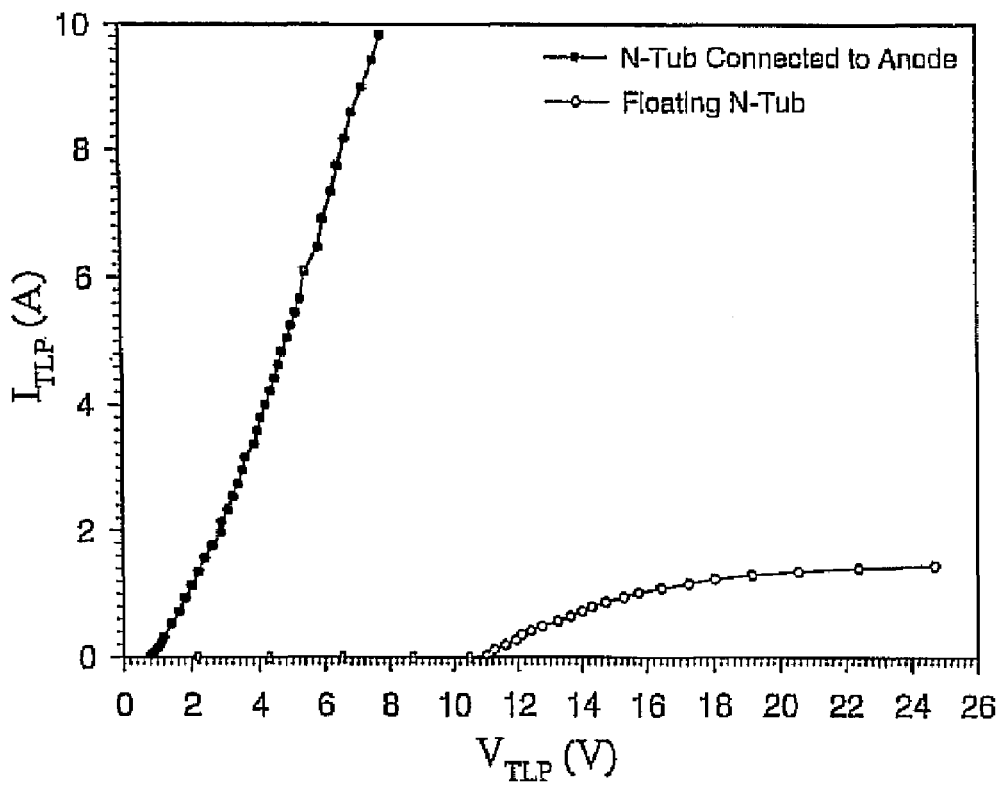

The effect of the anode-N-Tub interconnection on the reverse characteristics is depicted in FIG. 9B. The reverse breakdown of the devices with a floating N-Tub is increased up to a maximum of about 12.2 V by increasing the distance (Drl) between the p-side and n-side of the guard ring such as those described in FIGS. 5A and 5B and FIGS. 6A and 6B. Much higher reverse breakdowns can also be obtained by changing the doping concentration in the n-side of the ring or in the intermediate N-Well 11 layer in devices such as those shown in FIGS. 5A and 5B and FIGS. 6A and 6B.

Figure 10A:
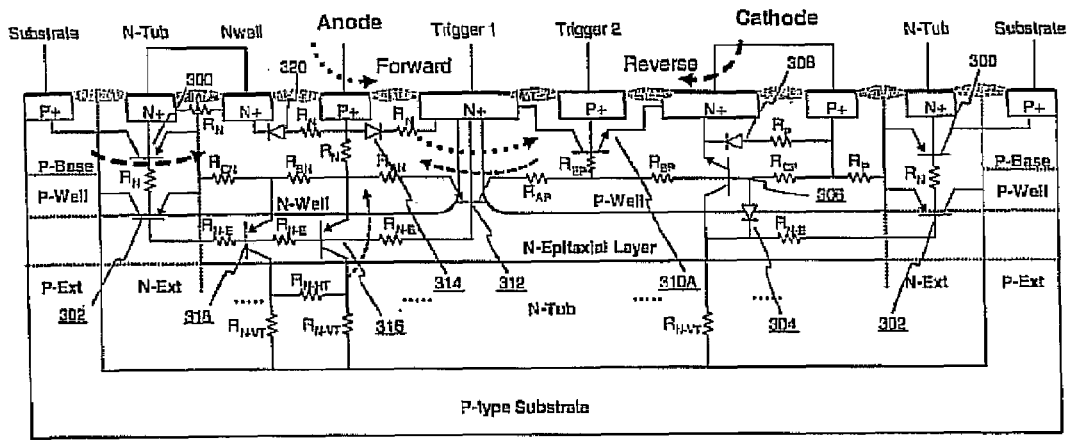
FIGS. 10A and 10B are cross-sectional views of the n- and p-type DSTT with internal circuit diagram and the forward and reverse conduction paths.
Figure 10B:
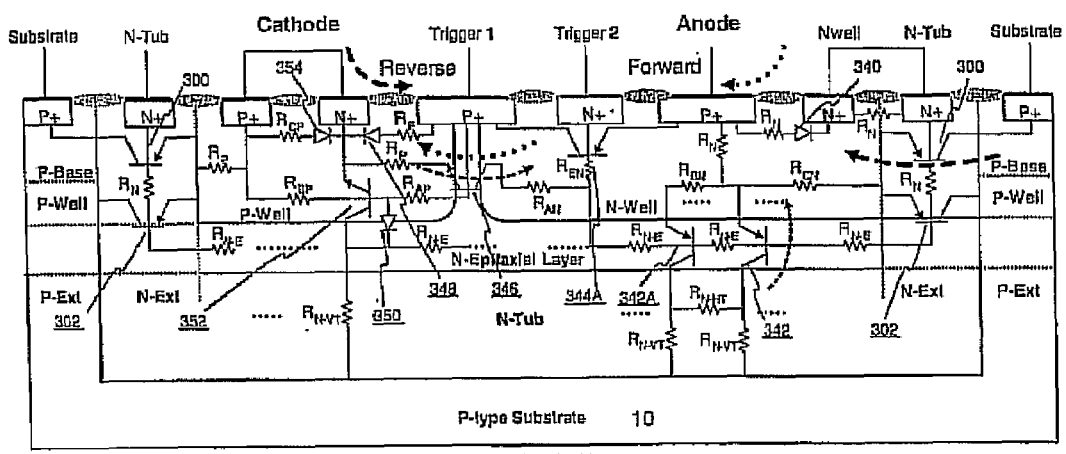

FIGS. 10A and 10B depict cross-sectional views of n- and p-type DSTTs with an equivalent circuit for the internal parasitic components and current paths for forward and reverse conduction. In FIG. 10A, vertically distributed open base PNP bipolar junction transistors (300 and 302) are obtained between the device and the outermost region corresponding to the P-side of the guard ring. When the substrate is connected to a reference voltage, Vs or Vss, the distributed PNP open base breakdown establishes a constraint for the voltage value that can be applied to the anode or cathode below the corresponding reference voltage. Internally in the embodiment, a high reverse breakdown voltage p/n junction 304 is identified between the P-Well and the N-Tub, and another p/n junction close to the surface 308, is identified between the highly doped regions of opposite conductivity type. A parasitic BJT is formed between the cathode and the substrate, the base of which is connected to the cathode. The breakdown voltage of this BJT should be high enough to guarantee no conduction when the cathode is moving above/below the substrate reference voltage. A lateral BJT 310A is indicated as a triggering component embedded in the embodiment. Trigger 1 and trigger 2 allow the alternative injection of carriers in the base of two BJTs (310A and 312) illustrated in FIG. 10A. The BJT 312 establishes the blocking voltage, while it also is the main path of current during the regenerative feedback. By extending the base region of 312, the injection efficiency is degraded and holding voltage can be shifted to higher levels. The diodes 314 and 320 are separated from the anode electrode by the contact and well resistance, the diode 314 is close to the surface and parallel to the forward conduction path. Conduction through the diode 314 is mainly obtained in the low current regime, while the device has not reached the on-state regenerative feedback. The diode 320 can be shorted to the anode or left with one of the sides floating. These conditions are referred to as the tied N-tub or floating N-tub configurations, respectively. Each of these configurations is applicable to different ICs operating conditions previously discussed. The high injection during the regenerative feedback modulates the intrinsic conductivity represented by the resistive network in the device, resulting in current distributed along the vertical direction and far from the surface, Laterally distributed BJTs in the anode side 316 and 318, are parallel to the guard-ring and identified between the anode and the substrate. While the anode can be connected to the substrate for specific conditions where the device discharges current from the reference substrate power rail to the cathode, in general, the anode voltage swing can vary from values below/above the substrate reference voltage. For these conditions the laterally distributed anode-substrate BJTs 316 and 318, should guarantee no conduction at voltage lower or equal to the BJT 312. The complementary p-type DSTT in FIG. 10B, also indicates the complementary array of components. BJTs labeled 342, 342A, and 352 follow the same function of the BJTs 318, 316, and 306, respectively. The complementary configuration, however, includes different bipolar structures for the triggering 346 and regenerative feedback, 346, 344A, and 352. Because these components interact but at the same time can be independently optimized, the use of the complementary configurations and predetermined dimensions allows for the versatile design of the previous illustrated circuit components and associated I-V characteristics.

Figure 11A:
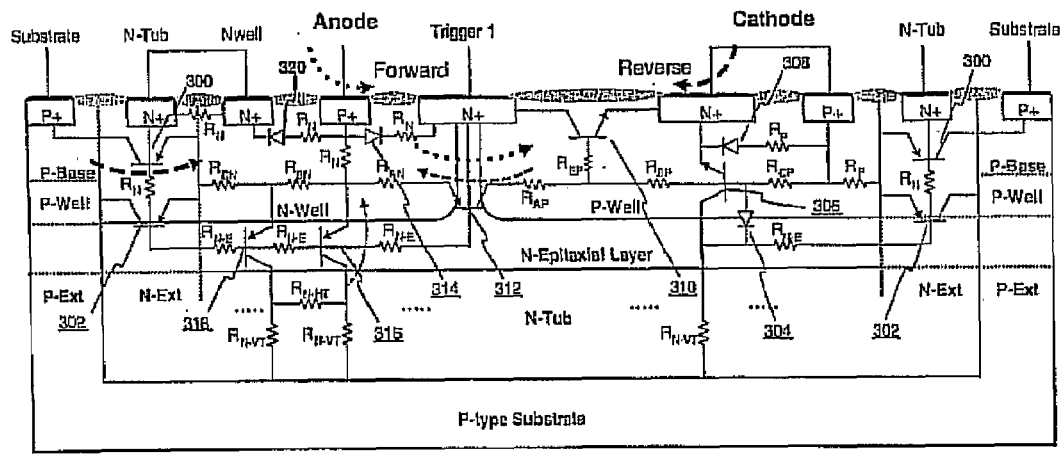
FIGS. 11A and 11B are cross-sectional views of the n- and p-type SSTT with internal circuit diagram and the forward and reverse conduction paths.
Figure 11B:
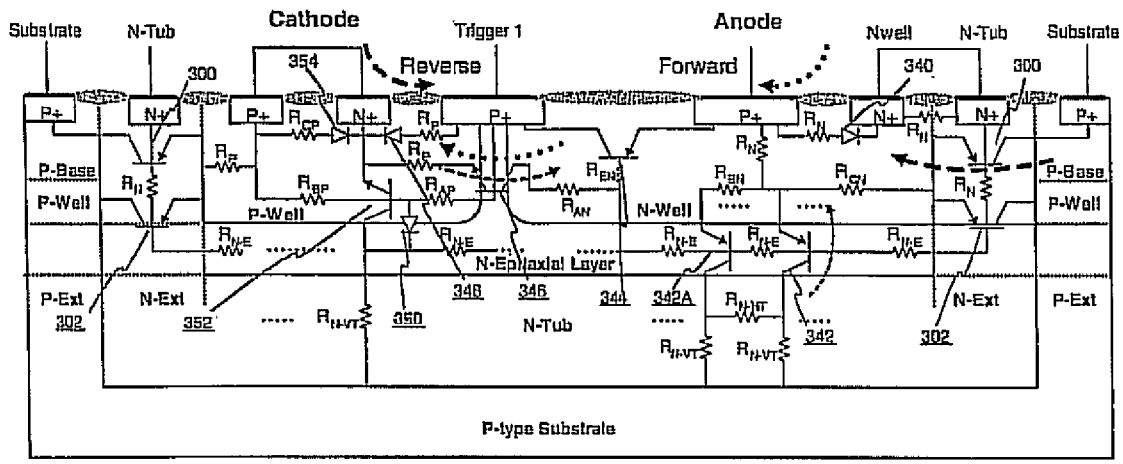

Equivalent cross-sectional views and labels are depicted in FIGS. 11A and 11B for the n- and p-type SSTT, respectively. Differences between the cross-sectional views in FIGS. 10A and 10B and FIGS. 11A and 11B include the trigger 2 in the P-Well and N-Well for the n and p-type devices, respectively, the effect of which is the shift to higher triggering voltage if compared with the previous DSTTs configurations. As the device physics is similar in the different versions of the embodiments, the discussion of the STT structures operating conditions is focused next on the n-type SSTT.

The STT is studied for the two operating conditions, forward and reverse. The forward conduction of the device is mainly tuned by adjusting the internal lateral dimensions, but also the interconnection of the n-type part of the guard ring modifies the conduction characteristics in forward and reverse bias conditions. Two general cases are assessed for each operating condition: 1) STT with the n-part of the guard-ring connected to the anode and 2) STT with the n-part of the guard-ring floating.

The STT allows the flexible design of ESD protection systems with a low- or high-reverse voltage conduction. A low reverse voltage in the protection device is the most common requirement for standard digital circuits. However, pad ESD protection with a high reverse breakdown is also required, for instance, for standard data communication ICs.

According to various embodiments, digital and analog ICs can be operated with a signal at the I/O pads within the range of the core circuit power supplies. For instance, this is the case of applications with normal operation signals varying only from the minimum supply voltage (Vss) to the maximum supply voltage (Vdd) such as in the device shown in FIG. 4A. In these applications, a forward-biased junction from Vss to the pad provides the protection for a negative ESD event.

Figure 12:
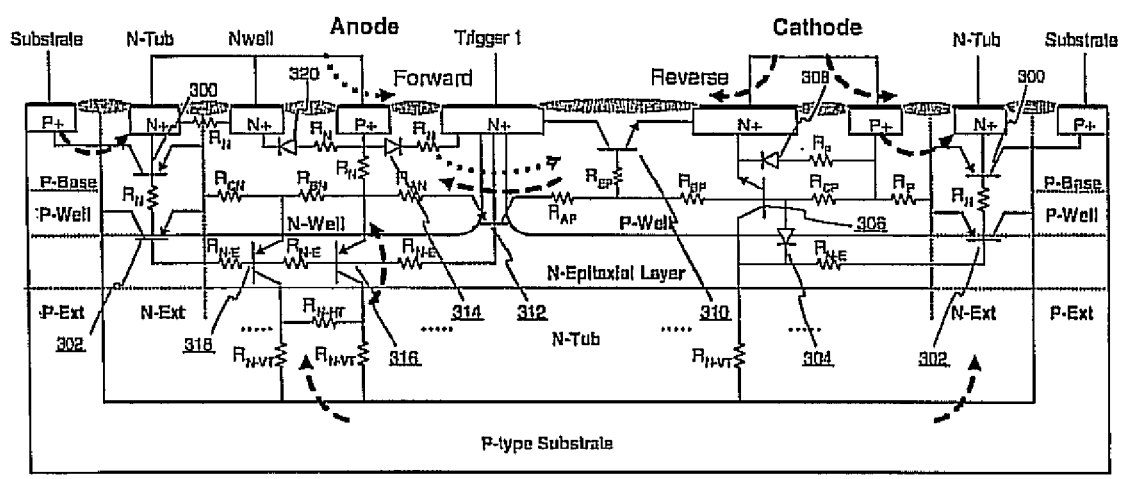
FIG. 12 is a cross-sectional view of the n-type SSTT with internal equivalent circuit and current paths for the case where the n-tub portion of the guard-ring is connected to the anode of the device.

The STTs allow the design of a low reverse voltage by connecting the n-part of the guard-ring to the anode of the device as shown, for example, in FIG. 12. According to various embodiments, the n-part of the guard-ring can be connected to the N-Well, for example, 16 in the device shown in FIG. 6A, and both of them connected to the anode, for example, 32 in the device shown in FIG. 6A and 315 in FIG. 4A. Assuming the common condition where the p-part of the guard-ring (48 in FIG. 6A) is connected to Vss, when the voltage of the anode is pulled down below Vss by a negative ESD, at the voltage of the guard-ring p-n junction, the current increases abruptly and the maximum negative voltage is given by the voltage of a forward-biased p-n junction as shown in FIG. 12. Because the STT is not very well optimized for the reverse conduction, for a very high level of ESD in reverse, an additional diode may be added to shunt the STT in order to share the current and avoid damage for over-stress in the guard-ring. For applications where the substrate is connected to a negative voltage (Vm) lower than Vss, the substrate to N-Tub junction is always reverse biased during normal operation condition, and the STT with a shunt diode is also effective in protecting circuits with these kinds of conditions.

FIG. 12 shows equivalent circuit symbols distributed along the lateral and vertical directions and the corresponding conduction path. The various circuit elements are identified as previously described for FIG. 10A. The conduction path is presented from the p-type substrate and the p-part of the guard-ring to the N-Well, but also from the cathode to the n-part of the guard-ring and to the N-Well. The different conduction paths show a desirable distribution of the reverse current along the vertical and lateral directions of the device, which increases the ratio of ESD reverse current per unit area that the device can support. A similar reverse operation condition is obtained for the n- and p-type DSTT in FIGS. 5A and 5B and for the p-type SSTT in FIG. 6B.

ICs for data communication and various other mixed-signal processing applications may be required to operate at I/O bipolar voltages much higher than the core circuit power supplies, (i.e., above Vdd and below Vss). For these kinds of ICs, bidirectional ESD protection cells without latchup problems in both directions and protection capability to very high levels of bipolar ESD stress at the I/O pad constitute fundamental design requirements. In the present teaching, these conditions are designed for different applications without the reliability problems that may be found in other kinds of devices with gates.

The SSTT is operated at voltages below Vss using the interconnections depicted in FIG. 11A, see 420 in FIGS. 4B and 4C. FIG. 11A shows different groups of open-base BJTs. A group of lateral shunt PNPs is formed parallel to the STT surface between the p-side of the guard-ring (13, 17, 38, and 48 in FIGS. 5A and 5B and FIGS. 6A and 6B) and the anode and another group is formed between the intermediate P-Well (18 in FIGS. 5A and 5B and FIGS. 6A and 6B) in the cathode side and the anode. A second group of shunt PNPs is vertically distributed between the p-type substrate and the anode. For the fabricated STTs, the lowest breakdown and thus the determination of the trigger voltage is found in the open base BJTs laterally distributed between the p-side of the guard-ring and the anode, see FIG. 11A.

FIG. 11A also shows the conduction paths. An important current at the reverse breakdown voltage (OBV) is obtained between the p-side of the guard-ring and the anode. Additional leakage current fluxes throughout the other open-base BJTs, but this leakage is very small. The reverse OBV of this open base BJT is found tunable between about −10.5V and about −12.2V by increasing the distance between the n- and p-side of the guard-ring (Drl in FIGS. 5A and 5B and FIGS. 6A and 6B) between about 1.2 µm and about 5.5 µm. This tunable OBV provides ESD protection design flexibility for most of the applications developed in sub-micron CMOS technology. Higher OBVs are also obtained by decreasing the doping concentration of the intermediate N-Well 16 and P-Well 13, see FIGS. 5A and 5B and FIGS. 6A and 6B. The reverse conduction characteristic of the floating N-Tub STTs though cannot be used for protection at high level of reverse ESD current. Because the conductivity of the open-base BJTs is very low, the maximum reverse current that the cell can support once OBV is reached is significantly smaller than that obtained in the forward condition and generally not suitable for ESD protection. Similar operating conditions are observed in the n- and p-type DSTTs devices presented in FIGS. 10A and 10B and the p-type SSTT shown in FIG. 11B.

Figure 13:
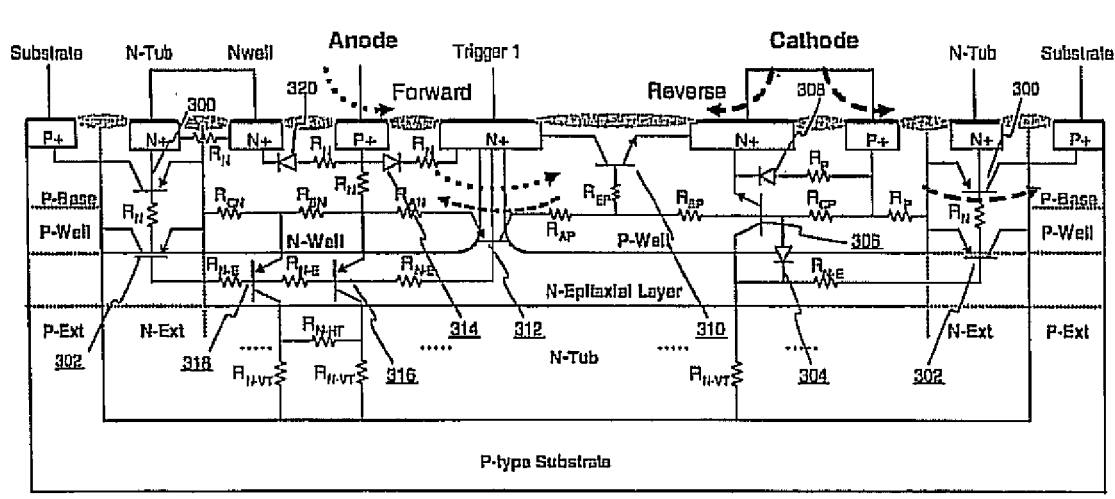
FIG. 13 is a cross-sectional view of the n-type SSTT with internal circuit diagram and the current paths for the case where the anode is connected to ground for negative ESD protection.

A bidirectional ESD protection is designed by using shunt STTs, one STT (420 FIG. 4B) with the anode to the first electrode e.g. the I/O pad, and the cathode to the second electrode (520 FIG. 4B), e.g. Vss, and the other STT (440 FIG. 4B) with the cathode to the first electrode (500 FIG. 4B), and the anode to the second electrode. FIG. 13 shows the cross-sectional view of an SSTT with the current paths when the anode is connected to the substrate and to Vss. The various structural elements labeled in FIG. 13 are identified as previously described in FIG. 10A. The forward conduction follows a similar path previously shown in FIG. 11A, but the reverse conduction takes place at the OBV of the lateral BJT between the cathode P-Well 18 and the p-side of the guard ring, which results in the present process are close to about 11.2V. The shunt STTs cell provides the necessary bidirectional ESD protection to high current levels.

An alternative bidirectional protection can be provided as well with a combination of STTs for forward protection and a shunt zener diode tuned at the right reverse condition for the reverse ESD, see 600 FIG. 4C. For instance, Local Area Networks (LANs) are sometimes operated between 12 and −7 V. The I/O ESD protection for ICs used for this kind of network is bidirectional and not symmetric with the ground reference. A critical condition in this particular design is found for a positive ESD zap, because a high current over the 12 V gives rise to high power dissipation. For this condition, an array of zener diodes, such as 620 shown in FIG. 4C, with a Vss to pad breakdown voltage slightly higher than 7 V and a pad to Vss breakdown voltage much higher than 12 V can be used shunt to an STT device 420 in FIG. 4C. The STT provides the low leakage protection with snapback to a lower power dissipation condition for the positive ESD events and the zener diode such as 640 and 660 FIG. 4C for a negative ESD with clamp voltage much below Vss (680 FIG. 4C).

For the n- and p-type STTs, the voltage snaps back during the on-state due to similar vertical and lateral bipolar effects. The n-type SSTT device is used as a reference for the following discussion of the forward on-state operations.

FIG. 12 shows the n-type SSTT with the n-side of the guard-ring connected to the anode of the device, see 315 FIG.

4A. During the forward on-state, two dimensional avalanche generation of carriers in the high-field region (22 in FIG. 6A) results in hole current into the P-Well (18 in FIG. 6A). The voltage dropped in the P-Well resistance REP (see FIG. 12) raises the P-Well to LDD N⁺ (18 to 26 in FIG. 6A) potential and eventually this junction is forward-biased. Electrons injected from the cathode (26 in FIG. 6A) into the P-Well (18 in FIG. 6A) are collected at the LDD N⁺ (22 in FIG. 6A) passing through the P-Well to anode lateral parasitic BJT. Eventually avalanche breakdown takes place in the P-Well to anode PNP, and the current increases as a function of the avalanche multiplication in the high field region in the anode side due to thermal generation and high injection of minority carriers.

The avalanche-generation current provides the base emitter current in the P-Well to anode PNP. This parasitic BJT has a distributed effect from the surface to the bulk of the device as well as laterally between the N-well and P-well. As the PNP bipolar turns on, carriers move through the base or N-Well to P-Well space charge region. At the time that the BJT starts conducting, the number of carriers from anode to cathode increases abruptly, a quasi-neutral region is created in the intermediate N-Well and P-Well, and the voltage snaps back to a lower electric field condition.

In the N-Well to P-Well junction (16 to 18 in FIG. 6A) the contact potential is variable along the junction and proportional to the ratio of the majority carrier doping concentrations at each side of the space charge region. Thus, the reverse conduction condition is different along the bulk of the device. The level of minimum contact potential at the blocking junction is obtained at some distance from the surface. This is the place where the initial reverse conduction by impact ionization and tunneling gives rise to the next path for current conduction deep in the bulk of the device. This tunable effect provides a strength of the proposed ESD protection cell. Once the potential barriers reach the conduction conditions, the STT is able to open multiple high conduction paths.

The holding voltage after triggering is an integral function of the electric field distribution between the two terminals of the device, including primarily the voltage in the space charge neutral region where carriers are injected from both sides of the device. If the distance between the anode and cathode is increased, the holding voltage is increased as well but some characteristics in the device may be degraded. Likewise, higher injection of carriers increases the injection efficiency, and the device can be turned-on earlier but the voltage also snaps back to a lower holding voltage. One way to obtain the optimum design is to find the compromise solution that controls the trigger and the voltage in the junctions by using the appropriate lateral dimensions of the device and the appropriate dimensions for the anode and cathode contacts in order to avoid a very high injection in the anode but without violation of the design rules. The low on-state voltage in the blocking junction, the creation of a region of quasi-neutral electron-hole plasma along the junction, and a better distribution of the electric field along the device and deeper in the bulk are some of the further advantages of the STTs that allow a better performance at high current conditions and in a lower power dissipation per unit area than existing ESD protection methods.

For the STTs with n-side of the guard-ring (N-Tub) floating (see 420 in FIGS. 4B and 4C), the transverse area for current flux between anode and cathode is narrower. For the SSTT, the forward conduction is depicted in FIGS. 11A and 11B. These figures show the lateral and vertical PNP BJTs with floating N-Well, (16 in FIG. 6A). The N-Well to P-Well (i.e. base-collector of the lateral BJTs in the anode) breakdown is due to instability caused by carrier avalanche multiplication at the distributed PNP BJT. Similar to the case previously described, electrons are generated by impact ionization of holes injected in the collector-base (CB) junction and it contributes to an effective base current, which in turn controls hole injection across the emitter-base (EB) diode. This situation creates a feedback system where the collector current is related to the effective base current, which is composed of one terminal current, the thermal generation of holes within the shunt lateral transistors, and the feedback component due to the impact ionization of injected electrons as well as by the forward gain which is characterized by the emitter efficiency.

In this device, the conditions for the trigger voltage are similar to those previously detailed for the device with the N-Tub tied to the anode. However, the effective resistance is smaller and also the voltage that can be withheld along the device is smaller. This effect along with the open base conditions in the PNP in the anode side give rise to smaller holding voltages and slightly smaller trigger voltages.

In general, for both interconnection conditions previously presented, in addition to the sustained high injection condition after snapback, a so called dual-carrier-injection is also present in the total current density. In this condition, a drift current density due to the majority carriers of both kinds—holes and electrons—gives rise to a quasi-neutral electron-hole plasma that controls the electric field in the junction. A second component given by carrier diffusion is important during the triggering process but less important during the 'on' condition of the device, and a final component due to tunneling effects may be present at the blocking junction during the on-state high-current regime. Additionally, the relationship between resistance and current is not a mutually exclusive multiplication of two constants, but the current density modulates the conductance. Therefore, the on-state I-V characteristics are also affected by the modulation of the conductivity, which changes with the device interconnections and with the lateral dimensions.

The STT's I-V characteristics are designed for different I/O pad and supply clamp conditions by adjusting the internal lateral dimensions. The holding voltage can be dependent on: 1) the dimension 'D1' (22 in FIGS. 5A and 6A and 24 in FIGS. 5B and 6B); 2) the size and equivalent resistance of the anode contact (32 in FIGS. 5A and 6A and 28 in FIGS. 5B and 6B); 3) the dimension L in the DSTTs (42 in FIGS. 5A and 44 in FIG. 5B) and in the SSTTs (40 in FIGS. 5A and in 5B); and 4) the equivalent resistance of the intermediate N-Well in the anode side.

The holding voltage increases with an increase in D1, reduction of emitter contact size, which provides emitter injection control, an increase in the channel length, and a reduction in the equivalent N-Well resistance. Increasing the length D1 affects the way that the N-Well to P-Well blocking junction is conducting during the on-state.

As the distance D1 increases, the well-known model of the SCRs formed by two BJTs is no longer valid. Therefore, voltages higher than that obtained by just two forward-biased junctions can be tuned along the device. This tunable holding voltage is sustained in the blocking junction and to some extent by the distributed BJT and passive network in the bulk of the device.

When the holding voltage is increased, the effective conduction path is shrunk to a more superficial region, the maximum current that the cell can support is lower, but the maximum effective power before a hard failure occurs in the device is almost independent of changes in the lateral dimensions. The reduction of the hard-failure maximum current when the holding voltage is increased is an unavoidable tradeoff, but even at relatively high holding voltages, the design with STTs provides a much more efficient and robust protection scheme for standard digital circuits. The STTs are also the first reliable devices designed for the protection of ICs with I/O voltages much higher than the core circuit power supply and at levels where devices with gate cannot be used.

The tendency previously discussed is observed in various STTs. For devices with floating N-Tub though, a lesser adjustment at high holding voltages level is possible due to the open-base BJTs existent in the anode of the STTs.

The reverse characteristics of the STTs are not dependent on the internal lateral dimensions, but on the guard-ring structure and the N-Well doping concentration. FIG. 9B compares the TLP measurements of the reverse I-V characteristics for the two cases previously discussed. The direct effects of the internal dimensions of the STTs over the device characteristics are summarized in TABLE 3.

Very high levels of ESD protection are required for IC applications that involve direct interconnections with other equipment through cables, such as, for example, IC ports for interconnection between electronic equipment, devices for network communication, LAN equipment, etc. For these kinds of applications, the ICs are required to comply with the highest level of the ESD IEC standard, e.g. about 60 Amp ESD for 16.5 kV IEC. This requirement along with the standard operating voltage of the interface, e.g. digital levels for communication transceivers, introduces important complications in the integration and development of these kinds of ICs in advanced CMOS technologies.

For these kinds of stringent ESD requirements, different combinations of STT devices separated by a common p-side of the guard ring 130, not only can meet various bidirectional operating voltage requirements, but also can provide the required ESD protection of the IC. However, the direct scaling of the device width is not practical and in some cases not feasible in the layout area, neither provides direct scaling of the ESD protection capability and the necessary reduction of the device on-state resistance.

Figure 14:
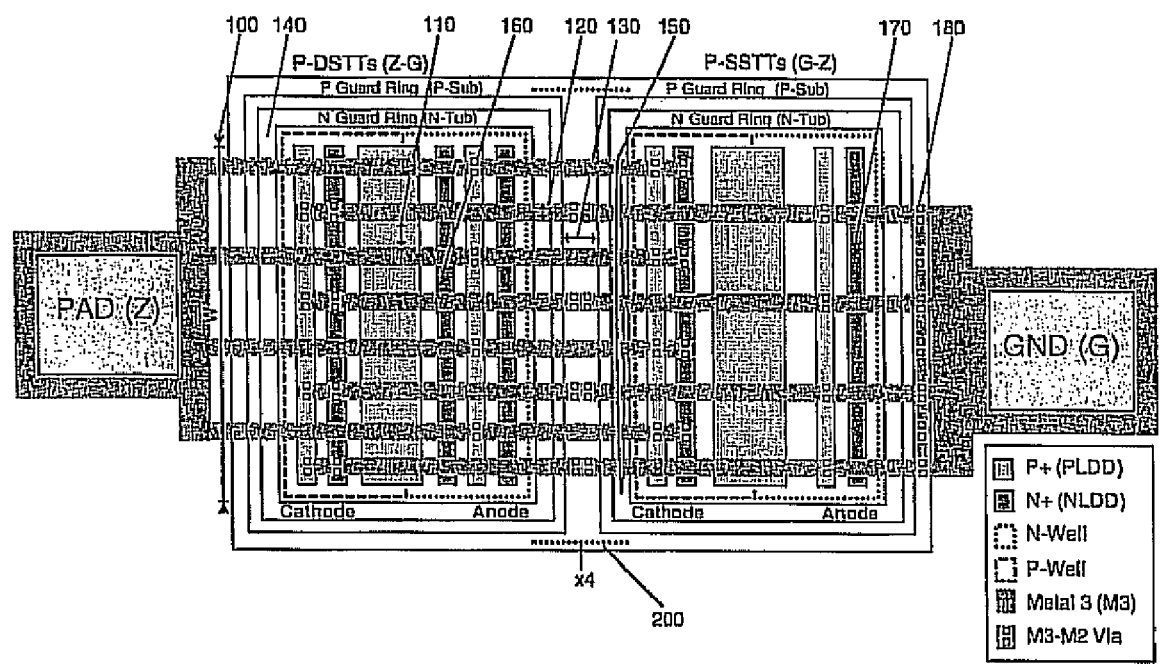
FIG. 14 is a layout top view for a bidirectional ESD protection cell implemented with multiple finger STTs for 16.5 kV IEC protection. This cell can be triggered in both polarities between 9-12 V and the holding voltage can be varied in a range of 1.5 V to 11.5 V. The holding current is also further increased in the multifinger array.

FIG. 14 shows a multifinger cell with interdigitated stripes optimized to a given width 120 and minimum separation 110 for uniform and low metal interconnection resistance and even number of stripes 150 designed instead. In this layout scheme, the STT devices are kept at relatively small widths (100 FIG. 14), e.g. W=200 μm, and all the device interconnections are accomplished in such a way that the contacts and vias (180 FIG. 14) are aligned and the current is very well distributed along the multifinger structure. Custom triggered circuits can be alternatively used in different regions of the protection cell, e.g. 160 in FIG. 14, see 230, 330 and 345 in FIGS. 4A and 460, 480 in FIG. 4B.

For an effective level of protection over 16.5 kV IEC, FIG. 14 shows the layout top-view of a bidirectional multifinger STT cell with N-Tub 170 floating and the necessary number of fingers 200. The reverse conduction voltage of the STT devices is tuned by adjusting the distance between the n and p-sides of the ring structure 140 or by adjusting the doping concentrations. A similar layout scheme can be designed for any component of the different custom protection systems, including mixed-signal I/O protection and supply clamps. The ESD protection characteristic of the multifinger STT cell are scaled-up with the number of fingers and the protection cell is easily adjusted for integration inside the layout area of any IC. This step in the ultimate integration on-chip of the ESD protection device has been in general one of the most difficult steps in the design with devices that involve snapback characteristics.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising."

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of making an electrostatic discharge (ESD) device, the method comprising:
   providing a substrate doped to a first conductivity type;
   forming a first well doped to the first conductivity type in the substrate, the first well comprising,
      a first region doped to the first conductivity type,
      a second region doped to a second conductivity type, and
      a first isolation region disposed between the first region and the second region;
   forming a second well doped to a second conductivity type in the substrate adjacent to the first well, the second well comprising,
      a third region doped to the first conductivity type,
      a fourth region doped to the second conductivity type, and
      a second isolation region disposed between the third region and the fourth region; and
   forming a first trigger contact comprising a highly doped region a junction between the first well and the second well.

2. The method of making an electrostatic discharge (ESD) device according to claim 1, wherein the junction comprises a gap that separates the first well from the second well by a distance t.

3. The method of making an electrostatic discharge (ESD) device according to claim 2, wherein the gap comprises a graded doping profile.

4. The method of making an electrostatic discharge (ESD) device according to claim 1, wherein the first trigger contact is formed in the junction between the first well and the second well and between a third isolation region and another isolation region.

5. The method of making an electrostatic discharge (ESD) device according to claim 1 further comprising:
   forming a guard ring isolation surrounding the first well and the second well.

6. The method of making an electrostatic discharge (ESD) device according to claim 1, wherein the first region, second region, third region, and fourth region are formed by implantation.

7. The method of making an electrostatic discharge (ESD) device according to claim 1 further comprising:
   forming a second trigger contact in the first well, wherein the second trigger contact is separated from the second region by a fourth isolation region.

8. The method of making an electrostatic discharge (ESD) device according to claim 7, wherein each of the first isolation region, second isolation region, third isolation region, another isolation region, and fourth isolation region are formed by implantation, local oxidation of silicon, or blocking silicide in a silicide processes.

9. The method of making an electrostatic discharge (ESD) device according to claim 1, wherein the first isolation region has a length from about 500 nm to about 3.5 μm, and wherein the second isolation region has a length from about 500 nm about 3.5 μm.

10. The method of making an electrostatic discharge (ESD) device according to claim 1, wherein the first trigger contact has a length from about 500 nm to about 11.2 μm.

11. The method of making an electrostatic discharge (ESD) device according to claim 7, wherein the fourth isolation region has a length from about 500 nm to about 1.5 μm.

12. The method of making an electrostatic discharge (ESD) device according to claim 1, where the device is used as a supply clamp or as an input/output protection in an integrated circuit operating in a range of voltages from about 2.5 V to about 18 V.

13. A method of making an electrostatic discharge (ESD) device, the method comprising:
    providing a substrate doped to a first conductivity type, wherein the substrate comprises an epitaxial layer doped to a second conductivity type;
    forming a first well doped to the first conductivity type in the substrate;
    forming a cathode in the first well, the cathode comprising,
        a first region doped to the first conductivity type,
        a second region doped to the second conductivity type, and
        a first isolation region disposed between the first region and the second region;
    forming a second well doped to the second conductivity type in the substrate adjacent to the first well;
    forming an anode in the second well, the anode comprising,
        a third region doped to the first conductivity type,
        a fourth region doped to the second conductivity type, and
        a second isolation region disposed between the third region and the fourth region; and
    forming a first trigger contact comprising a highly doped region disposed at a junction between the first well and the second well.

14. The method of making an electrostatic discharge (ESD) device according to claim 13, wherein the junction comprises a gap having a graded doping, wherein the gap separates the first well from the second well by a distance t.

15. The method of making an electrostatic discharge (ESD) device according to claim 13, wherein each of the first isolation region and the second isolation region are formed by implantation or local oxidation of silicon.

16. The method of making an electrostatic discharge (ESD) device according to claim 13 further comprising:
    forming a guard ring isolation surrounding the first well and the second well.

17. The method of making an electrostatic discharge (ESD) device according to claim 13, wherein the first region, second region, third region, and fourth regions are formed by implantation.

18. The method of making an electrostatic discharge (ESD) device according to claim 13 further comprising:
    forming a second trigger contact in the first well, wherein the second trigger contact comprises a fifth region doped to the first conductivity type, and wherein the second trigger contact has a length from about 500 nm to about 6.5 μm, and further wherein the length of the second trigger contact controls the gain of a cathode embedded bipolar junction transistor during on-state regenerative feedback.

19. The method of making an electrostatic discharge (ESD) device according to claim 13 further comprising:
    forming a second trigger contact in the second well, wherein the second trigger contact comprises a fifth region doped to the second conductivity type1 and wherein the second trigger contact has a length from about 500 nm to about 6.5 μm, and further wherein the length of the second trigger contact controls the gain of a cathode embedded bipolar junction transistors during the on-state regenerative feedback.

20. The method of making an electrostatic discharge (ESD) device according to claim 13, wherein the first isolation region has a length D2 from about 500 nm to about 1.5 μm and the second isolation region has a length D2' from about 500 nm to about 1.5 μm.

21. The method of making an electrostatic discharge (ESD) device according to claim 13, wherein the first trigger contact has a length D2 from about 500 nm to about 11.2 μm.

22. The method of making an electrostatic discharge (ESD) device according to claim 21 further comprising:
    forming another isolation region of length D2" between the third region and the first trigger contact, and wherein varying the length of the another isolation region varies a trigger voltage and an on-state holding voltage.

23. The method of making an electrostatic discharge (ESD) device according to claim 21 further comprising:
    forming a third isolation region of length D2' between the second region and the first trigger contact, and wherein varying the length of the third isolation region varies a trigger voltage and an on-state holding voltage.

24. The method of making an electrostatic discharge (ESD) device according to claim 19 further comprising:
    a fourth isolation region of length D2''' disposed between the fifth region and the first trigger contact, and wherein varying the length D2''' varies the trigger voltage and on-state holding voltage.

25. The method of making an electrostatic discharge (ESD) device according to claim 13, wherein the first isolation region, second isolation region, and D2''' have a length from about 500 nm to about 1.5 μm.

* * * * *

UNITED STATES PATENT AND TRADEMARK OFFICE
CERTIFICATE OF CORRECTION

PATENT NO. : 7,479,414 B2
APPLICATION NO. : 11/871269
DATED : January 20, 2009
INVENTOR(S) : Javier A. Salcedo et al.

It is certified that error appears in the above-identified patent and that said Letters Patent is hereby corrected as shown below:

Title Page item 73 should read -

ASSIGNEE:
    INTERSIL AMERICAS INC.
    1001 MURPHY RANCH ROAD
    MILPITAS, CALIFORNIA 95035

ASSIGNEE:
    UNIVERSITY OF CENTRAL FLORIDA
    12443 RESEARCH PARKWAY
    ORLANDO, FLORIDA 32826

Signed and Sealed this

Twenty-sixth Day of January, 2010

David J. Kappos
*Director of the United States Patent and Trademark Office*